(12) United States Patent
Maruyama et al.

(10) Patent No.: US 8,471,314 B2
(45) Date of Patent: Jun. 25, 2013

(54) SOLID-STATE IMAGING DEVICE, METHOD FOR PRODUCING SAME, AND CAMERA

(75) Inventors: Yasushi Maruyama, Kanagawa (JP); Tetsuji Yamaguchi, Kanagawa (JP); Takashi Ando, Kanagawa (JP); Susumu Hiyama, Kanagawa (JP); Yuko Ohgishi, Tokyo (JP)

(73) Assignee: Sony Corporation (JP)

( * ) Notice: Subject to any disclaimer, the term of this patent is extended or adjusted under 35 U.S.C. 154(b) by 140 days.

(21) Appl. No.: 12/703,848

(22) Filed: Feb. 11, 2010

(65) Prior Publication Data
US 2010/0141816 A1 Jun. 10, 2010

Related U.S. Application Data

(62) Division of application No. 11/677,645, filed on Feb. 22, 2007, now Pat. No. 8,183,603.

(30) Foreign Application Priority Data

Feb. 24, 2006 (JP) .................................. 2006-048173
Feb. 5, 2007 (JP) .................................. 2007-025807

(51) Int. Cl.
*H01L 31/062* (2006.01)

(52) U.S. Cl.
USPC .............................. 257/292; 438/57; 257/223

(58) Field of Classification Search
USPC .................................... 257/223, 292; 438/57
See application file for complete search history.

(56) References Cited

U.S. PATENT DOCUMENTS

| 6,501,109 B1 * | 12/2002 | Chi .............................. 257/223 |
| 2002/0039144 A1 * | 4/2002 | Yamada ........................ 348/311 |
| 2002/0171102 A1 * | 11/2002 | Shizukuishi .................. 257/315 |
| 2003/0214595 A1 * | 11/2003 | Mabuchi ....................... 348/294 |
| 2005/0056861 A1 * | 3/2005 | Ko et al. ....................... 257/184 |
| 2005/0151218 A1 | 7/2005 | Mouli |

FOREIGN PATENT DOCUMENTS

| JP | 09-082585 | 3/1997 |
| JP | 2003-031785 | 1/2003 |

OTHER PUBLICATIONS

Kazutoshi Onozawa et al.; A MOS Image Sensor With a Digital-Microlens; IEEE Transactions on Electron Devices; vol. 55, No. 4; Apr. 2008.
C. Marques and P. Magnan; Analysis and potentialities of backside-illuminated thinned CMOS imagers; Proceedings of SPIE; vol. 5251; Bellingham, WA; 2004.
Scientific Charge-Coupled Devices; Spie Press; p. 185-272.

* cited by examiner

*Primary Examiner* — Thao Le
*Assistant Examiner* — Geoffrey Ida
(74) *Attorney, Agent, or Firm* — Sheridan Ross P.C.

(57) ABSTRACT

A solid-state imaging device includes a substrate having a first surface and a second surface, light being incident on the second surface side; a wiring layer disposed on the first surface side; a photodetector formed in the substrate and including a first region of a first conductivity type; a transfer gate disposed on the first surface of the substrate and adjacent to the photodetector, the transfer gate transferring a signal charge accumulated in the photodetector; and at least one control gate disposed on the first surface of the substrate and superposed on the photodetector, the control gate controlling the potential of the photodetector in the vicinity of the first surface.

10 Claims, 29 Drawing Sheets

FIG. 5

|  | ACCUMULATION | READ | RESET |
|---|---|---|---|
| CONTROL GATE | − | − OR + | − |
| TRANSFER GATE | − | + | − |
| RESET GATE | 0 | 0 | + |

FIG. 12

|  | ACCUMULATION | READ 1 | READ 2 | RESET |
|---|---|---|---|---|
| SECOND CONTROL GATE | − | − | − | − |
| FIRST CONTROL GATE | − | + | − | − |
| TRANSFER GATE | − | − | + | − |
| RESET GATE | 0 | 0 | 0 | + |

ABSORPTION COEFFICIENT OF 450-nm-LIGHT IN PHOTODIODE

ABSORPTION COEFFICIENT OF 550-nm-LIGHT IN PHOTODIODE

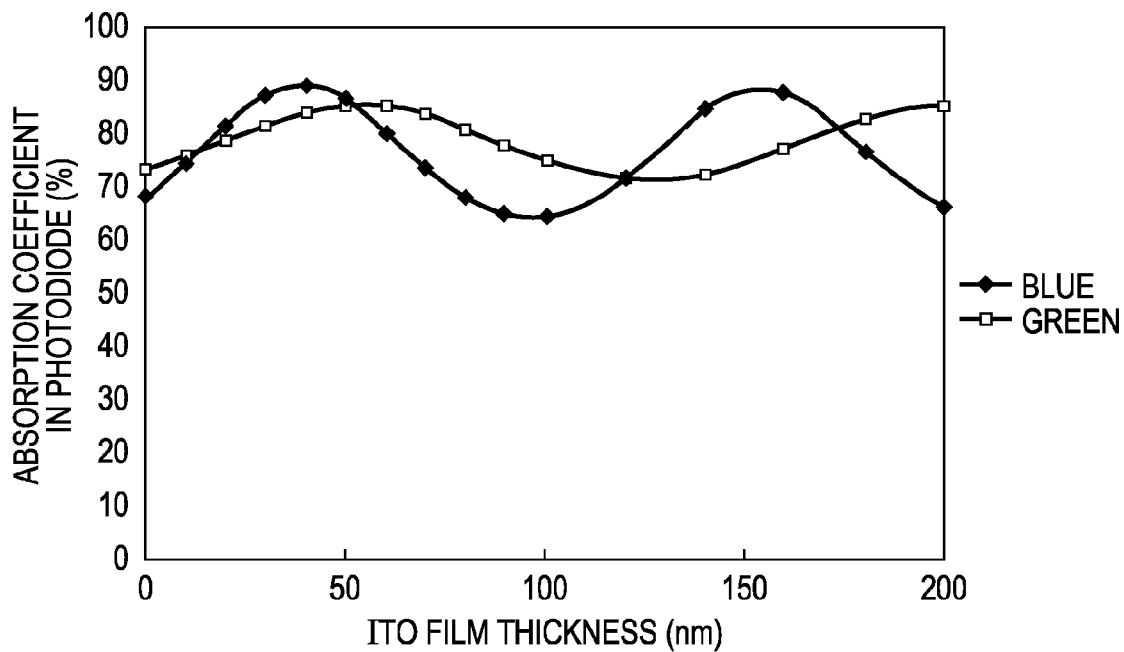
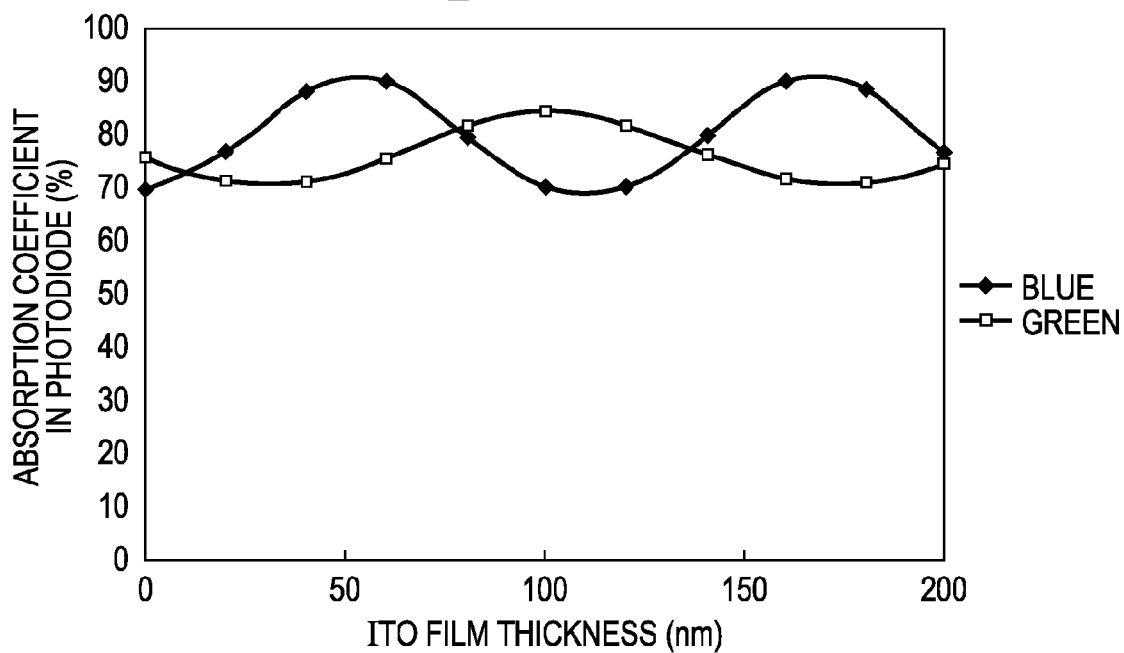

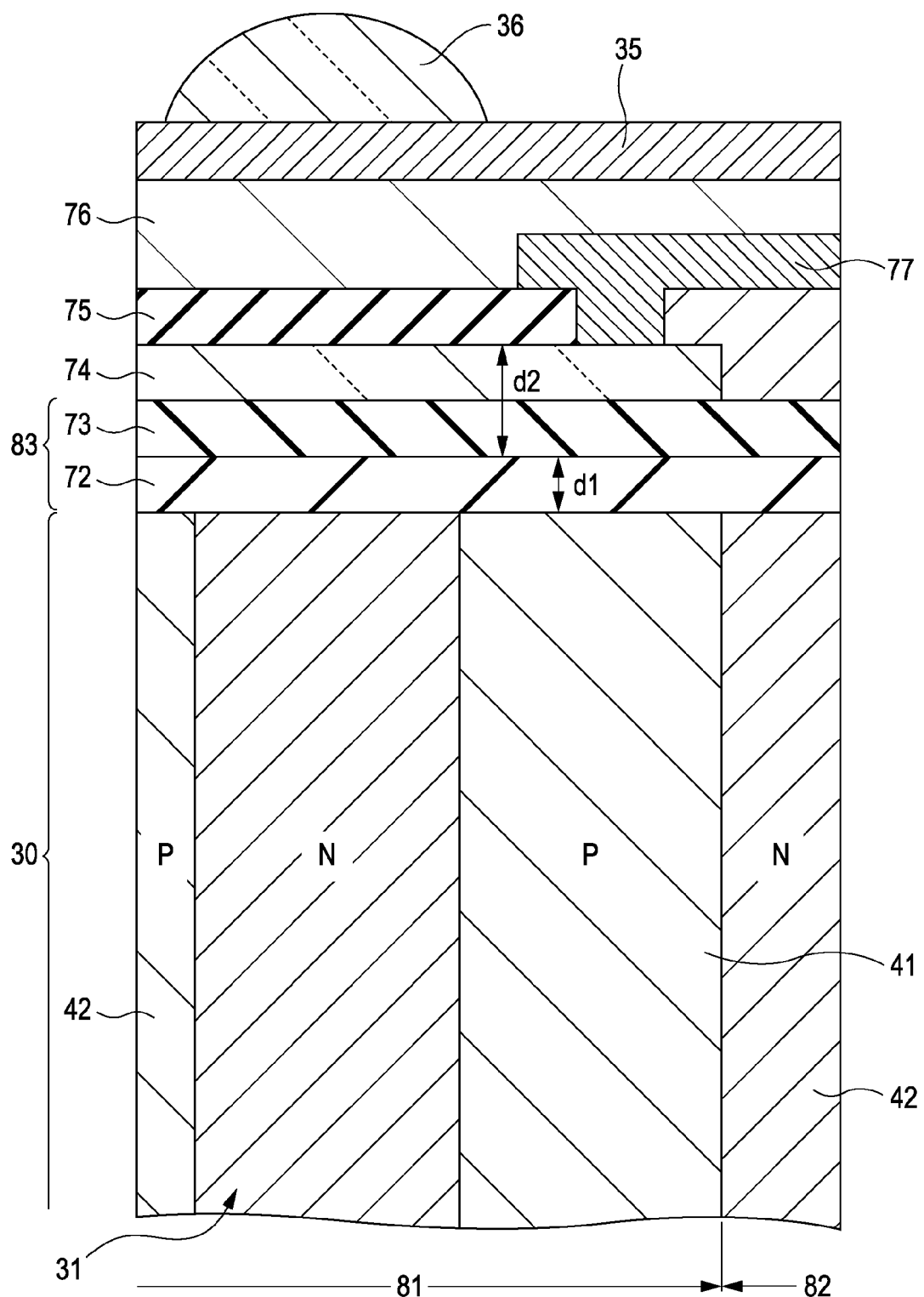

SOLID-STATE IMAGING DEVICE, METHOD FOR PRODUCING SAME, AND CAMERA

RELATED APPLICATION DATA

This application is a division of U.S. patent application Ser. No. 11/677,645, filed Feb. 22, 2007, the entirety of which is incorporated herein by reference to the extent permitted by law. The present application claims the benefit of priority to Japanese Patent Application JP 2006-048173 filed in the Japanese Patent Office on Feb. 24, 2006, and Japanese Patent Application JP 2007-025807 filed in the Japanese Patent Office on Feb. 5, 2007, the entireties both of which are incorporated by reference herein to the extent permitted by law.

BACKGROUND OF THE INVENTION

1. Field of the Invention

The present invention relates to a solid-state imaging device, a method for producing the device, and a camera including the solid-state imaging device.

2. Description of the Related Art

It is known that in solid-state imaging devices, such as charge-coupled device (CCD) image sensors and complementary metal oxide semiconductor (CMOS) image sensors, crystal defects in photodiodes serving as photoreceivers and interface states at interfaces each between the photoreceiver and an insulating film on the photoreceiver function as sources of dark current. A buried photodiode structure is effectively used in order to inhibit the generation of dark current due to the interface states. The buried photodiode includes an n-type semiconductor region and a shallow p-type semiconductor region (hole accumulation region) for inhibiting the dark current, the p-type semiconductor region having a high impurity concentration and being disposed on the surface of the n-type semiconductor region, i.e., disposed in the vicinity of the interface between the n-type semiconductor region and the insulating film. A method for producing the buried photodiode generally includes implanting B ions or $BF_2$ ions serving as p-type impurities; and performing annealing to form a p-type semiconductor region in the vicinity of the interface between the n-type semiconductor region and the insulating film that constitute the photodiode.

However, in the case of the formation of the buried photodiode by a known ion implantation, heat treatment at a temperature as high as 700° C. or higher is essential for the activation of impurities. Thus, in a low-temperature process at a temperature of 400° C. or lower, it is difficult to form the p-type semiconductor region by ion implantation. Furthermore, in view of the inhibition of diffusion of impurities, the method for forming the p-type semiconductor region by ion implantation and annealing with activation at a high temperature for a long period of time is not desirable.

In CMOS image sensors, pixels each include a photodiode and various transistors, such as a read transistor, a reset transistor, and an amplifying transistor. A signal photoelectrically converted with the photodiode is processed with the transistors. Each pixel is overlaid with a wiring layer including multiple metal-lead sublayers. The wiring layer is overlaid with a color filter that specifies the wavelength of light incident on the photodiode and an on-chip lens that converges light on the photodiode.

In CMOS image sensors, the leads on the pixels disadvantageously blocks light, thus reducing sensitivity. When light reflected from the leads is incident on adjacent pixels, color mixture and the like are caused. Thus, Japanese Unexamined Patent Application Publication No. 2003-31785 discloses a backside-illumination solid-state imaging device that photoelectrically converts light incident from the backside of a silicon substrate including photodiodes and various transistors, the silicon substrate having a thickness reduced by polishing the backside thereof. As described above, the photodiode includes the shallow p-type semiconductor region (hole accumulation region) for inhibiting the dark current, the p-type semiconductor region having a high-impurity concentration. In the backside-illumination solid-state imaging device, the hole accumulation region is disposed at each of front and back sides of the substrate.

However, ion implantation limits the formation of the shallow p-type semiconductor region having high-impurity concentration. Thus, a further increase in impurity concentration in the p-type semiconductor region in order to inhibit dark current deepens the p-type semiconductor region. The deep p-type semiconductor region may degrade the read ability of the transfer gate because the pn junction of the photodiode is remote from the transfer gate.

SUMMARY OF THE INVENTION

In consideration of the above-described problems, it is desirable to provide a solid-state imaging device capable of inhibiting dark current due to at least an interface state, a method for producing the device, and a camera including the solid-state imaging device.

A solid-state imaging device according to an embodiment of the present invention includes a substrate having a first surface and a second surface, light being incident on the second surface side; a wiring layer disposed on the first surface side; a photodetector formed in the substrate and including a first region of a first conductivity type; a transfer gate disposed on the first surface of the substrate and adjacent to the photodetector, the transfer gate transferring a signal charge accumulated in the photodetector; and at least one control gate disposed on the first surface of the substrate and superposed on the photodetector, the control gate controlling the potential of the photodetector in the vicinity of the first surface.

A method according to an embodiment of the present invention for producing a solid-state imaging device including a substrate having a first surface and a second surface, a wiring layer being disposed on the first surface side, and light being incident on the second surface side includes the steps of forming a photodetector including a first region of a first conductivity type in the substrate: forming a transfer gate at an area on the first surface of the substrate and adjacent to the photodetector; and forming a control gate at an area on the first surface of the substrate and superposed on the photodetector.

A camera according to an embodiment of the present invention includes a solid-state imaging device having a substrate having a first surface and a second surface, light being incident on the second surface side; and a wiring layer disposed on the first surface side; an optical system that guides incident light to the second surface side; and a signal-processing circuit that processes an output signal of the solid-state imaging device; wherein the solid-state imaging device further includes a photodetector disposed in the substrate and including a first region of a first conductivity type, a transfer gate disposed on the first surface of the substrate and adjacent to the photodetector, the transfer gate transferring a signal charge accumulated in the photodetector; and a control gate disposed on the first surface of the substrate and superposed on the photodetector, the control gate controlling the potential of the photodetector in the vicinity of the first surface.

According to the embodiments of the present invention, the control gate can control the potential of the photodetector in the vicinity of the first surface, thus suppressing the generation of the dark current. Furthermore, the signal charge is accumulated in the first region of the first conductivity type and in the vicinity of the first surface of the photodetector, thus improving the ability of the transfer gate to read the signal charge.

A solid-state imaging device according to an embodiment of the present invention includes a transparent conducive film disposed above a light-receiving surface of a photodetector; and an insulating film disposed between the light-receiving surface and the transparent conductive film, the insulating film having a thickness of 50 nm or less.

A solid-state imaging device according to an embodiment of the present invention includes a transparent conductive film disposed above a light-receiving surface of a photodetector; and a stacked film disposed between the light-receiving surface and the transparent conductive film, the stacked film including at least two types of sub-film, wherein the sub-film that is in contact with the light-receiving surface is a silicon oxide sub-film having a thickness of 50 nm or less.

A method according to an embodiment of the present invention for producing a solid-state imaging device includes the steps of forming an insulating film on a light-receiving surface of a photodetector formed in a substrate, the photodetector including a first region of a first conductivity type, and the insulating film having a thickness of 50 nm or less; and forming a transparent conductive film on the insulating film.

A method according to an embodiment of the present invention for producing a solid-state imaging device includes the steps of forming a stacked insulating film on a light-receiving surface of a photodetector having a first region of a first conductivity type, the photodetector being formed in a substrate, the stacked insulating film including at least two types of sub-film and including a silicon oxide sub-film in contact with the light-receiving surface, and the silicon oxide sub-film having a thickness of 50 nm or less; and forming a transparent conductive film on the stacked insulating film.

A camera according to an embodiment of the present invention includes an optical system that guides incident light to a photodetector of a solid-state imaging device; and a signal-processing circuit that processes an output signal of the solid-state imaging device; wherein the solid-state imaging device includes a transparent conductive film disposed above a light-receiving surface of the photodetector, and an insulating film disposed between the light-receiving surface and the transparent conductive film, the insulating film having a thickness of 50 nm or less.

A camera according to an embodiment of the present invention includes an optical system that guides incident light to a photodetector of a solid-state imaging device; and a signal-processing circuit that processes an output signal of the solid-state imaging device; wherein the solid-state imaging device includes a transparent conductive film disposed above a light-receiving surface of the photodetector, and a stacked film disposed between the light-receiving surface and the transparent conductive film, the stacked film including at least two types of sub-film, wherein the sub-film that is in contact with the light-receiving surface is a silicon oxide sub-film having a thickness of 50 nm or less.

According to the embodiments of the present invention, the transparent conductive film can control the potential of the light-receiving surface of the photodetector, thus suppressing the generation of the dark current. Furthermore, since the thickness of the insulating film disposed between the light-receiving surface and the transparent conductive film is set at 50 nm or less, a combination of the insulating film and the transparent conductive film forms an antireflective film. Alternatively, in the case of the stacked insulating film, the thickness of the silicon oxide sub-film in contact with the light-receiving surface is set at 50 nm or less, a combination of the insulating film and the transparent conductive film forms an antireflective film. The resulting antireflective film improves the absorption coefficient of light in the photodetector, thus increasing sensitivity.

A solid-state imaging device according to an embodiment of the present invention includes a film disposed on a light-receiving surface of a photodetector and having a negative fixed charge. Preferably, the film having the negative fixed charge is an at least partially crystallized insulating film.

A camera according to an embodiment of the present invention includes an optical system that guides incident light to a photodetector of a solid-state imaging device; and a signal-processing circuit that processes an output signal of the solid-state imaging device; wherein the solid-state imaging device includes a film disposed on the light-receiving surface of the photodetector and having a negative fixed charge.

According to the embodiments of the present invention, the film is disposed on the light-receiving surface of the photodetector and has the negative fixed charge, thereby forming a hole accumulation state on the surface of the photodetector and suppressing the generation of the dark current due to the interface state.

BRIEF DESCRIPTION OF THE DRAWINGS

FIG. 5 is a table showing an example of bias in operations of the solid-state imaging device according to the first embodiment;

FIG. 12 is a table showing an example of bias in operations of the solid-state imaging device according to the second embodiment;

FIG. 18 is a graph illustrating absorption coefficients of blue light and green light in the photodiode of the solid-state imaging device according to the fourth embodiment, the thickness of a silicon oxide film being fixed to 20 nm, and the thickness of a transparent conductive film (ITO film) being changed;

FIG. 19 is a graph illustrating absorption coefficients of blue light and green light in the photodiode of the solid-state imaging device according to the fourth embodiment, the thickness of the silicon oxide film being fixed to 160 nm, and the thickness of the ITO film being changed;

FIG. 20 is a fragmentary cross-sectional view of a substrate of the solid-state imaging device according to the fifth embodiment;

FIGS. 31D and 30E are each a process drawing (2) illustrating a method for producing the solid-state imaging device according to the sixth embodiment.

DESCRIPTION OF THE PREFERRED EMBODIMENTS

Embodiments of the present invention will be described below with reference to the drawings.

First Embodiment

Figure 1:
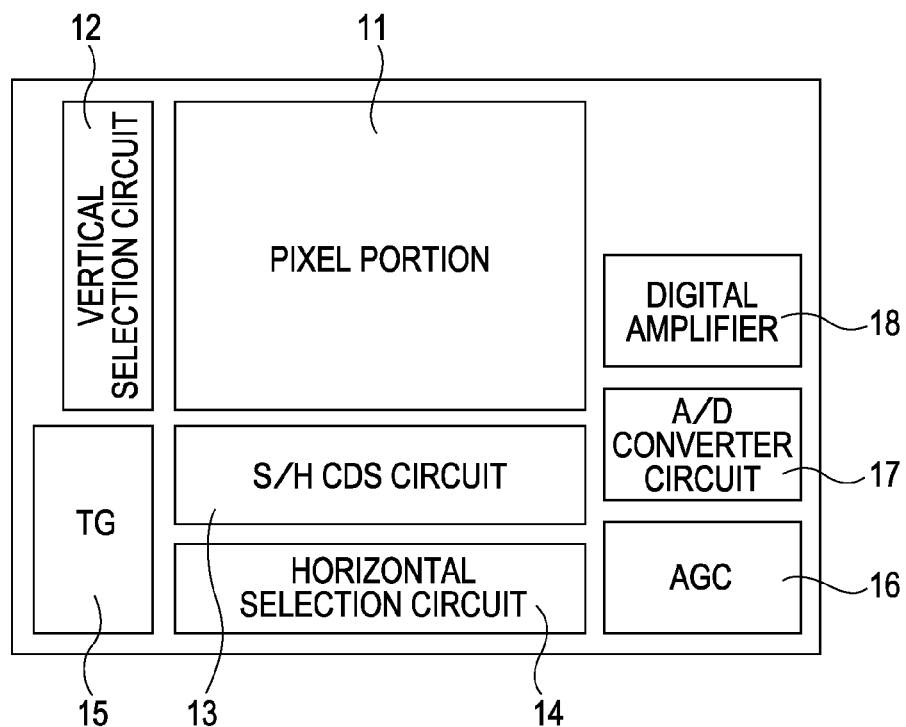
FIG. 1 is a schematic block diagram of a solid-state imaging device according to a first to sixth embodiments of the present invention.

FIG. 1 is a schematic block diagram of a solid-state imaging device according to an embodiment of the present invention.

The solid-state imaging device includes a pixel portion 11 and peripheral circuitry, the pixel portion 11 and the peripheral circuitry being disposed on the same semiconductor substrate. In this embodiment, the peripheral circuitry includes a vertical selection circuit 12, a sample-and-hold correlated double sampling (S/H CDS) circuit 13, a horizontal selection circuit 14, a timing generator (TG) 15, an automatic gain control (AGC) circuit 16, an A/D converter circuit 17, and a digital amplifier 18.

The pixel portion 11 includes many unit pixels that are arrayed in a matrix, as described below. Address lines and the like extend along rows of the pixels. Signal lines and the like extend along columns of the pixels.

The vertical selection circuit 12 successively selects the pixels on a row-by-row basis. The vertical selection circuit 12 reads pixel signals on a column-by-column basis and sends the pixel signals to the S/H CDS circuit 13 through vertical signal lines. The S/H CDS circuit 13 performs signal processing, such as CDS, of the pixel signals read from the columns of the pixels.

The horizontal selection circuit 14 successively reads the pixel signals stored in the S/H CDS circuit 13 and then outputs the pixel signals to the AGC circuit 16. The AGC circuit 16 amplifies the signals fed from the horizontal selection circuit 14 at predetermined gain and then outputs the resulting signals to the A/D converter circuit 17.

The A/D converter circuit 17 converts analog signals into digital signals and then outputs the signals to the digital amplifier 18. The digital amplifier 18 appropriately amplifies the digital signals fed from the A/D converter circuit 17 and then outputs the signals from a pad (terminal).

Operation of the vertical selection circuit 12, the S/H CDS circuit 13, the horizontal selection circuit 14, the AGC circuit 16, the A/D converter circuit 17, and the digital amplifier 18 is based on various timing signals fed from the timing generator 15.

Figure 2:
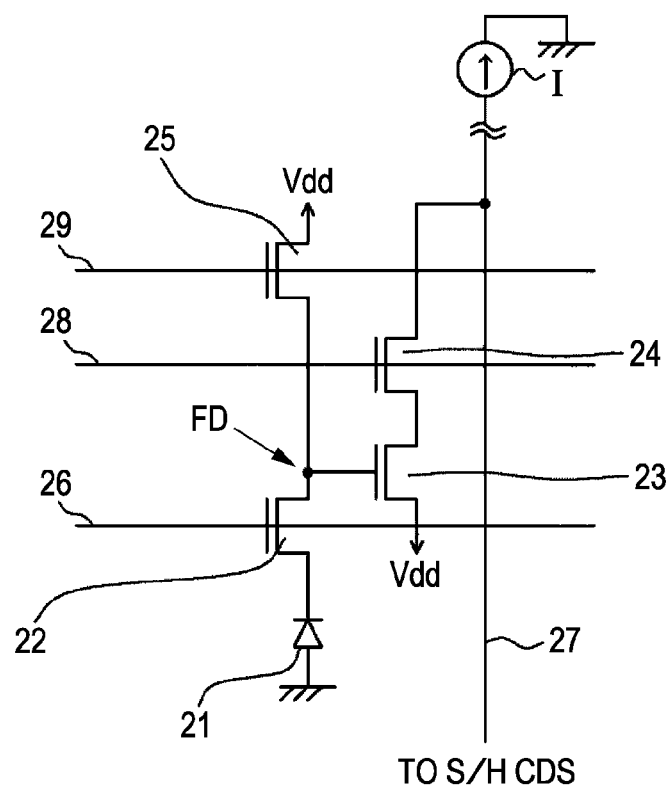
FIG. 2 is a schematic circuit diagram of a unit pixel of a pixel portion.

FIG. 2 is a schematic circuit diagram of an example of the unit pixel in the pixel portion 11.

The unit pixel includes, for example, a photodiode 21 as a photoelectric transducer. The unit pixel further includes four transistors, i.e., a transfer transistor 22, an amplifying transistor 23, an address transistor 24, and a reset transistor 25, as active elements per single photodiode 21.

The photodiode 21 photoelectrically converts incident light into a charge (in this case, electrons) corresponding to the amount of light. The transfer transistor 22 is connected between the photodiode 21 and a floating diffusion (FD) region. Sending a driving signal to a gate (transfer gate) through a driving line 26 results in the transfer of the electrons photoelectrically converted by the photodiode 21 to the floating diffusion region.

The floating diffusion region is connected to the gate of the amplifying transistor 23. The amplifying transistor 23 is connected to a vertical signal line 27 via the address transistor 24 and constitutes a source follower in combination with a constant current source disposed outside the pixel portion. An address signal is sent to the gate of the address transistor 24 through a driving line 28. When the address transistor 24 is ON, the amplifying transistor 23 amplifies the potential of the floating diffusion region and outputs a voltage corresponding to the potential to the vertical signal line 27. The voltage outputted from each pixel is sent to the S/H CDS circuit 13 through the vertical signal line 27.

The reset transistor 25 is connected between a power supply Vdd and the floating diffusion region. Sending a reset signal to the gate of the reset transistor 25 through a driving line 29 resets the potential of the floating diffusion region to the potential of the power supply Vdd. These operations of the transistors of the pixels arranged in a row are simultaneously performed because the gates of the transfer transistors 22, the address transistors 24, and the reset transistors 25 that are arranged in a row are connected.

Figure 3:
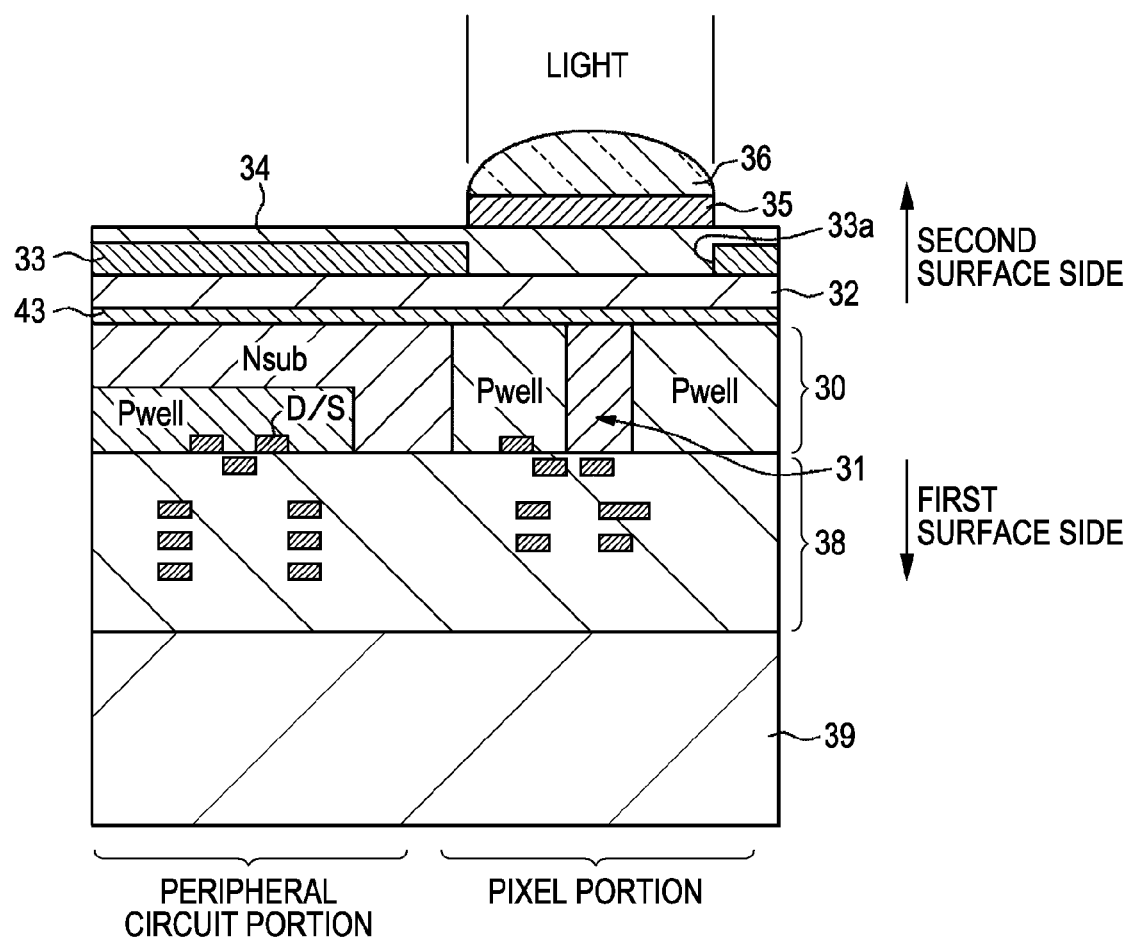
FIG. 3 is a schematic cross-sectional view of a solid-state imaging device.

FIG. 3 is a schematic cross-sectional view of the pixel portion and the peripheral circuit portion of the solid-state imaging device. The solid-state imaging device according to this embodiment receives light from a second surface side opposite a first surface side where a wiring layer 38.

A substrate 30 is, for example, an n-type silicon substrate and corresponds to a substrate according to an embodiment of the present invention. The substrate 30 includes a plurality of photodetectors 31 each constituting the unit pixel. Each of the photodetectors 31 corresponds to the photodiode 21 shown in FIG. 2. Each photodetector 31 is formed of a pn junction in the substrate 30. The substrate 30 is formed by reducing the thickness of a silicon wafer in such a manner that light is incident on the back side of the substrate. The thickness of the substrate 30 depends on the type of solid-state imaging device. In the case of a solid-state imaging device for visible light, the substrate 30 has a thickness of 2 to 6 µm. In the case of a solid-state imaging device for near-infrared rays, the substrate 30 has a thickness of 6 to 10 µm.

A light-shading film 33 is disposed on the second surface side (back side and light-incident side) of the substrate 30 and on an insulating film 32 composed of silicon oxide. The light-shading film 33 has an opening 33a that is located above each photodetector 31. The light-shading film 33 is overlaid with a protective film 34 composed of silicon nitride.

The protective film 34 is overlaid with a color filter 35 that only transmits light having predetermined wavelengths. A microlens 36 that allows incident light to converge on each photodetector 31 is disposed on the color filter 35.

Various transistors are formed on the first surface side of the substrate 30. The pixel portion of the substrate 30 includes the transistors 22 to 25 shown in FIG. 2 (not shown in FIG. 3). The peripheral circuit portion of the substrate 30 includes a p well and an n well (not shown). These wells include CMOS circuits.

The wiring layer 38 including multiple metal-lead sublayers is disposed on the first surface (front surface) of the substrate 30. A supporting substrate 39 is disposed on the wiring layer 38 with an adhesive layer (not shown) provided therebetween. The supporting substrate 39 is provided in order to increase strength of the substrate 30. The supporting substrate 39 is, for example, a silicon substrate.

Figure 4:
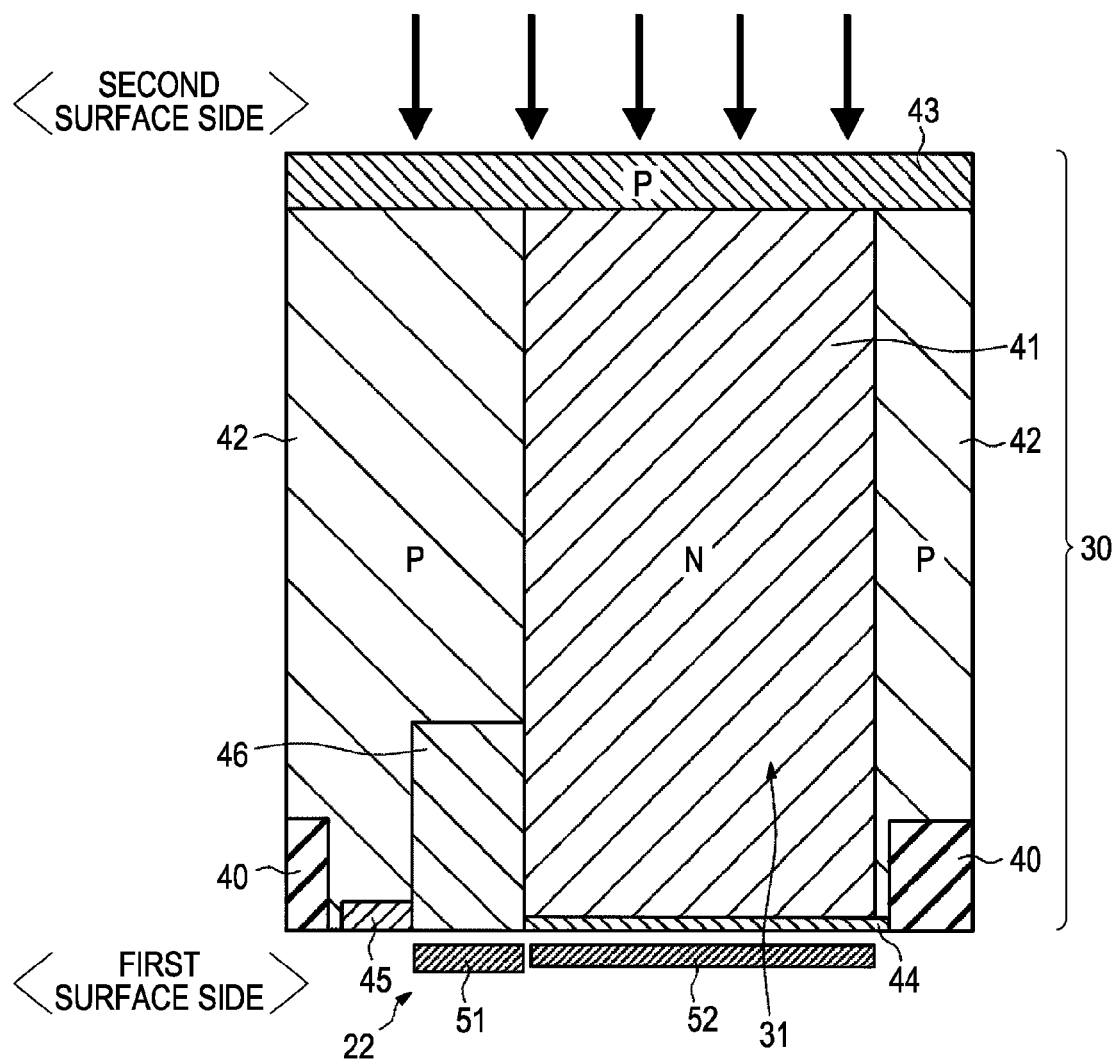
FIG. 4 is a fragmentary cross-sectional view of a substrate of the solid-state imaging device according to the first embodiment.

FIG. 4 is a fragmentary cross-sectional view of the pixel portion of the substrate 30.

An n-type charge-accumulation region 41 (region of a first conductivity type) is formed in each photodetector 31 of the substrate 30. To bring a portion for storing charge close to the first surface side, the charge-accumulation region 41 is preferably formed in such a manner that the concentration of impurities increases with increasing proximity to the first surface side. Furthermore, to efficiently introduce incident light, the charge-accumulation region 41 may be formed in such a manner that the area of the charge-accumulation region 41 increases with increasing proximity to the second surface side.

The charge-accumulation region 41 is surrounded by a p well 42 in the substrate 30. A shallow p-type hole-accumulation region 43 (region of a second conductivity type) is formed on the second surface side of the substrate 30 and on the entire surface of the pixel portion. A shallow p-type hole-accumulation region 44 (region of a second conductivity type) is formed on the first surface side of the substrate 30 and on each photodetector 31. The hole-accumulation regions 43 and 44 are formed on the first and second surface sides, respectively, of the charge-accumulation region 41, thereby constituting each photodetector 31 formed of the buried photodiode.

Element-isolation insulating films 40 composed of silicon oxide are formed on the first surface side of the substrate 30. An n-type floating diffusion region 45 is formed on the first surface side of the substrate 30. A p-type region 46 is formed between the floating diffusion region 45 and the charge-accumulation region 41 to electrically separating the floating diffusion region 45 from the charge-accumulation region 41.

A transfer gate 51 of the transfer transistor 22 is formed on the first surface of the substrate 30 with a gate-insulating film (not shown) provided therebetween. The transfer gate 51 is located adjacent to the photodetector 31 and is formed above the p-type region 46. The transfer gate 51 is, for example, composed of polysilicon.

A control gate 52 is formed on the first surface of the substrate 30 with a gate-insulating film (not shown) provided therebetween. The control gate 52 is superposed on the entire surface of the photodetector 31. The control gate 52 is composed of, for example, polysilicon. The control gate 52 preferably has a thickness comparable to the thickness of the transfer gate 51 in view of processability and resistance. Light is incident on the second surface side and thus is not blocked by the insulating film 32 disposed on the first surface side of the photodetector 31.

The transistors, i.e., the amplifying transistor 23, the address transistor 24, and the reset transistor 25 shown in FIG. 2, other than the transfer transistor 22 in the pixel are formed on the p well 42 formed on the first surface side of the substrate 30.

Operations of the solid-state imaging device according to this embodiment will be described below with reference to FIGS. 4 and 5. FIG. 5 is a table showing an example of bias during operations of the solid-state imaging device.

In a period of charge accumulation, light is incident in the direction indicated by the arrows shown in the figure and is then photoelectrically converted by the photodetector (photodiode) 31 to generate a signal charge in response to the amount of the incident light. The signal charge drifts in the charge-accumulation region 41 and is accumulated in the charge-accumulation region 41 in the vicinity of the hole-accumulation region 44. The application of a negative voltage to the transfer gate 51 in the period of charge accumulation results in an OFF state of the transfer transistor 22. The application of a negative voltage to the control gate 52 results in the accumulation of holes in the vicinity of the interface (first surface) of the substrate 30, thus reducing dark current.

The negative voltage applied to the control gate 52 varies in response to the impurity concentration below the control gate 52 and the thickness of the gate oxide film. For example, in the case where the hole-accumulation region 44 having a p-type impurity concentration of $1 \times 10^{16}/cm^3$ is formed by a 0.25-µm-generation process, the application of a voltage of about −1 V can sufficiently inhibit the generation of dark current.

In a read operation, the application of a positive voltage to the transfer gate 51 results in an ON state of the transfer transistor 22. The signal charge accumulated in the photodetector 31 is transferred to the floating diffusion region 45. The positive voltage is equal to, for example, a power supply voltage (3.3 V or 2.7 V).

In the read operation, the same negative voltage (for example, −1 V) as in the accumulation is basically applied to the control gate 52. Alternatively, in the read operation, a positive voltage of about +1 V may be applied to the control gate 52. In this case, the signal charge accumulated approaches the first surface side, thus improving the read ability of the transfer gate 51. A period of time required for readout is very shorter than the accumulation period. Thus, dark current due to the application of the positive voltage to the control gate 52 is low.

The potential of the floating diffusion region 45 varies in accordance with the amount of the signal charge transferred. The potential of the floating diffusion region 45 is amplified by the amplifying transistor 23. A voltage in response to the potential is outputted to the vertical signal line 27 (see FIG. 2).

In a reset operation, the application of a positive voltage to the gate of the reset transistor 25 resets the voltage of the floating diffusion region 45 to the voltage of the power supply Vdd. In this case, a negative voltage is applied to the transfer gate 51, resulting in an OFF state of the transfer transistor 22. Furthermore, a negative voltage is applied to the control gate 52.

The accumulation operation, the read operation, and the reset operation described above are repeated.

A method for producing the solid-state imaging device will be described below. In this embodiment, an exemplary method for simultaneously forming the transfer gate 51 and the control gate 52 will be described.

Figure 6A:
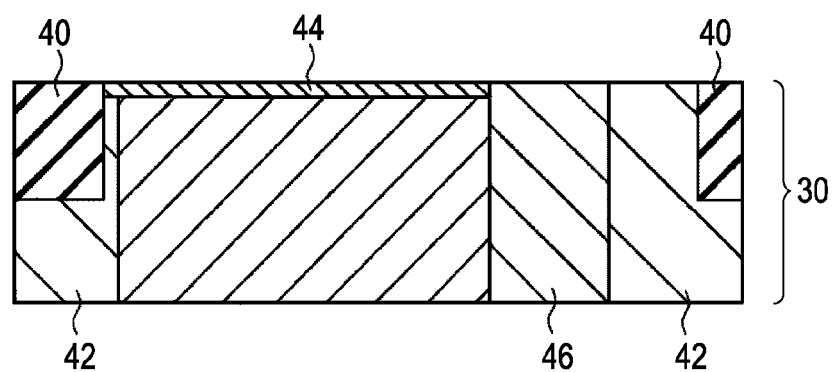
FIGS. 6A and 6B are each a cross-sectional view illustrating an example of the production process of the solid-state imaging device according to the first embodiment.

As shown in FIG. 6A, the element-isolation insulating film 40 is formed on the substrate 30 by shallow trench isolation (STI). Then, the n-type charge-accumulation region 41, the p well 42, the p-type hole-accumulation region 44, and the p-type region 46 are formed by ion implantation. The order of the formation of the regions is not limited.

Figure 6B:
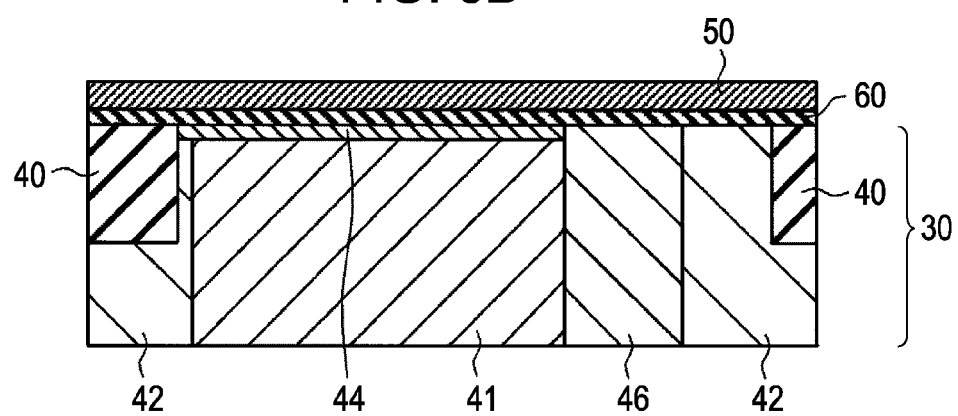

As shown in FIG. 6B, a gate-insulating film 60 composed of silicon oxide is formed on the substrate 30 by thermal oxidation. Subsequently, an electrode layer 50 composed of polysilicon is formed on the gate-insulating film 60 by chemical vapor deposition (CVD). The electrode layer composed of polysilicon has a thickness of 100 nm to 300 nm. Impurities are introduced into polysilicon during film formation.

Figure 7A:
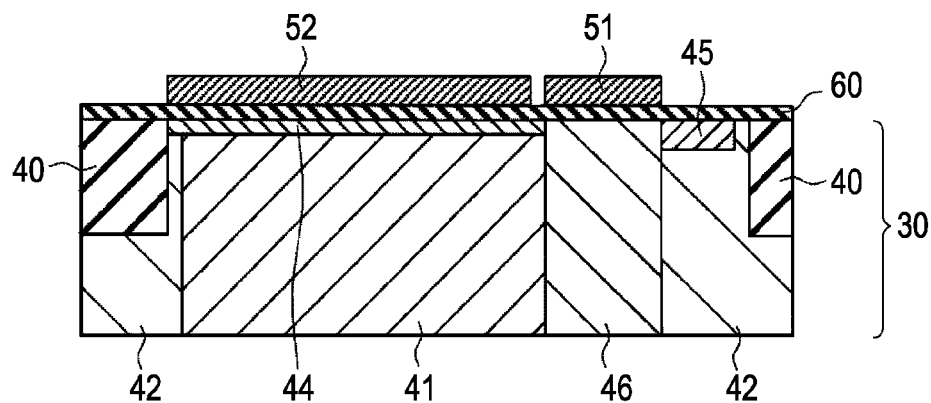
FIGS. 7A and 7B are each a cross-sectional view illustrating an example of the production process of the solid-state imaging device according to the first embodiment.

As shown in FIG. 7A, the electrode layer 50 is etched with a resist mask to form the transfer gate 51 and the control gate 52. At this time, the gates of other transistors (see FIG. 2) are simultaneously formed.

Figure 7B:
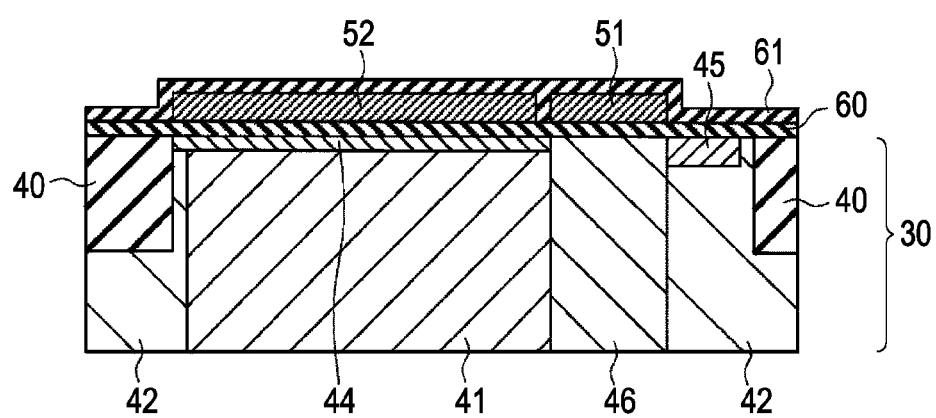

As shown in FIG. 7B, silicon oxide or silicon nitride is deposited on the entire surface to fill the gap between the transfer gate 51 and the control gate 52 with an insulating film 61.

Thereby, the transfer gate 51 and the control gate 52 are formed. A process subsequent to the formation of the gates will be described below with reference to FIG. 3. An insulating film and a lead are repeatedly formed on the first surface side of the substrate 30 to form the wiring layer 38. Then, the supporting substrate 39 is bonded to the wiring layer 38.

The back side of the substrate 30 is polished by chemical-mechanical polishing (CMP) to reduce the thickness of the substrate 30. Ion implantation and then activation annealing are performed to form the p-type hole-accumulation region 43 (see FIG. 4) on the second surface of the substrate 30.

Preferably, the temperature in the activation annealing does not exceed the upper temperature limit because the activation annealing is performed after the formation of the wiring layer. To satisfy the requirement, laser annealing having no effect of heat on the wiring layer is preferably employed.

The insulating film 32 composed of silicon oxide is formed on the substrate 30 by CVD. The light-shading film 33 is formed and patterned on the insulating film 32. The protective film 34 composed of silicon nitride is formed on the light-shading film 33 by CVD. Then, the color filter 35 and the microlens 36 are formed.

Thereby, the backside-illumination solid-state imaging device according to this embodiment is produced.

Another exemplary method for forming the transfer gate 51 and the control gate 52 that are each single layer will be described with reference to FIGS. 8 and 9. In FIGS. 8 and 9, the structure of the substrate is omitted.

The element-isolation insulating film 40 is formed on the substrate 30 by shallow trench isolation (STI) in the same way as described above. Then, the n-type charge-accumulation region 41, the p well 42, the p-type hole-accumulation region 44, and the p-type region 46 are formed by ion implantation (see FIG. 6A). The order of the formation of the regions is not limited.

Figure 8A:
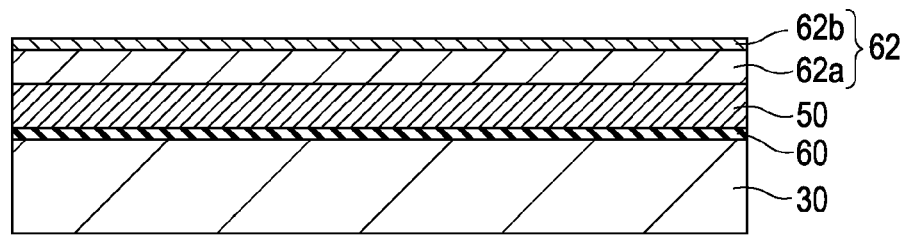
FIGS. 8A to 8C are each a cross-sectional view illustrating another example of the production process of the solid-state imaging device according to the first embodiment.

As shown in FIG. 8A, a gate-insulating film 60 composed of silicon oxide is formed on the substrate 30 by thermal oxidation. Subsequently, an electrode layer 50 composed of polysilicon is formed on the gate-insulating film 60 by chemical vapor deposition (CVD). The electrode layer composed of polysilicon has a thickness of 100 nm to 300 nm. Impurities are introduced into polysilicon during film formation. Subsequently, a silicon oxide film 62a and a silicon nitride film 62b are deposited on the electrode layer 50 by CVD to form a hard mask 62 including the silicon oxide film 62a and the silicon nitride film 62b.

Figure 8B:
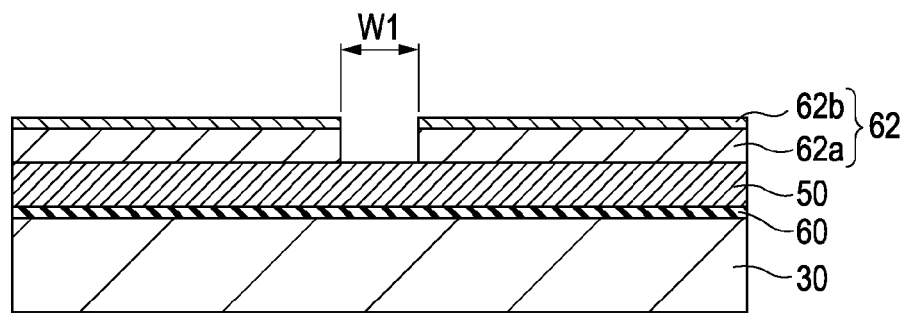

As shown in FIG. 8B, the hard mask 62 is patterned with a resist mask formed by lithography to form an opening having a width of W1 in the hard mask 62. The minimum of the width W1 depends on the limit of the resolution of lithography.

Figure 8C:
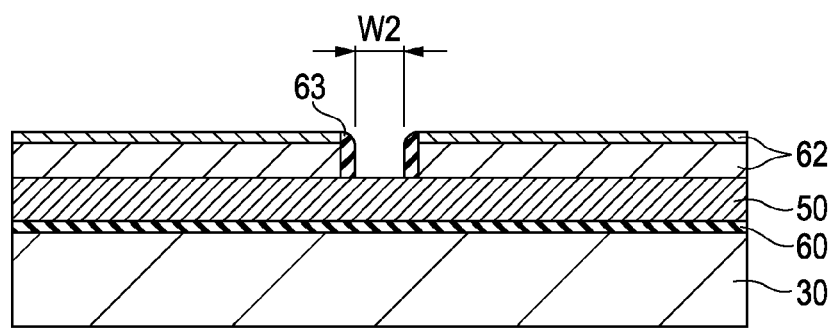

As shown in FIG. 8C, a side wall insulating film 63 is formed on the side wall of the opening in the hard mask 62. The side wall insulating film 63 is formed by depositing a silicon oxide film by CVD on the entire surface including the inner surface of the opening in the hard mask 62 and etching back the silicon oxide film. The formation of the side wall insulating film 63 results in an opening having a width of W2 smaller than the width W1 depending on the limit of the resolution of lithography.

Figure 9A:
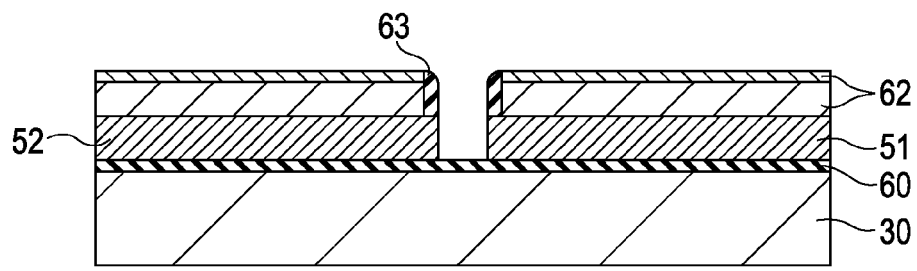
FIGS. 9A to 9C are each a cross-sectional view illustrating another example of the production process of the solid-state imaging device according to the first embodiment.

As shown in FIG. 9A, the electrode layer 50 is dry-etched with the hard mask 62 and the side wall insulating film 63 to form the transfer gate 51 and the control gate 52. The width of the gap between the transfer gate 51 and the control gate 52 is substantially equal to the width W2. According to need, the portion of the substrate 30 below the gap is subjected to ion implantation.

Figure 9B:
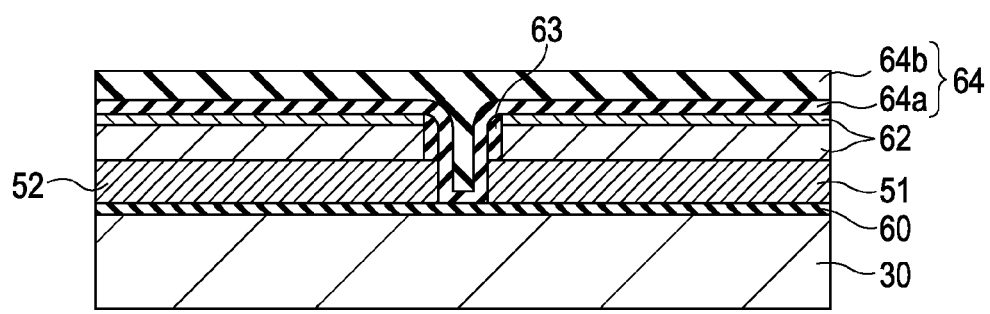

As shown in FIG. 9B, a silicon oxide film 64a and a silicon nitride film 64b are successively formed by CVD on the entire surface of the transfer gate 51, the control gate 52, and the gap to complete a buried insulating film 64.

Figure 9C:
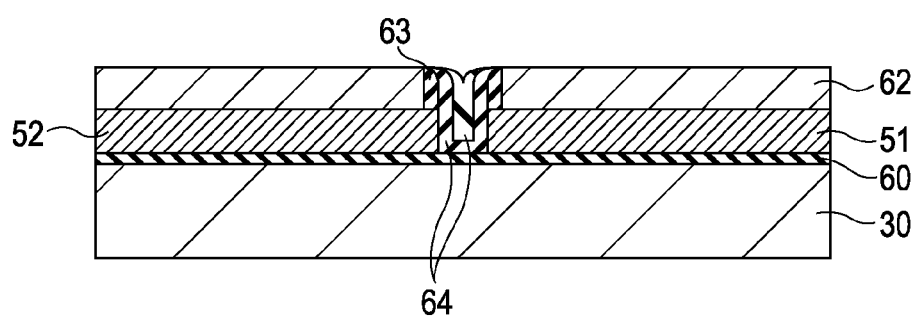

As shown in FIG. 9C, the buried insulating film 64 formed on the hard mask 62 is etched back to leave only the buried insulating film 64 formed in the gap between the transfer gate 51 and the control gate 52.

The subsequent steps are the same as above. In this embodiment, the method for forming the transfer gate 51 and the control gate 52 that are each single layer has been described as an example but is not limited. For example, after the formation of the control gate 52, a silicon oxide film is formed on the surface of the control gate 52 by oxidation, and then the transfer gate 51 may be formed. Alternatively, the transfer gate 51 may be formed in advance, and after a silicon oxide film may be formed on the side wall of the transfer gate 51 by oxidation, the control gate 52 may be formed. When the transfer gate 51 is formed in advance, the hole-accumulation region 44 may be formed with the transfer gate 51 as a mask for ion implantation.

Figure 10:
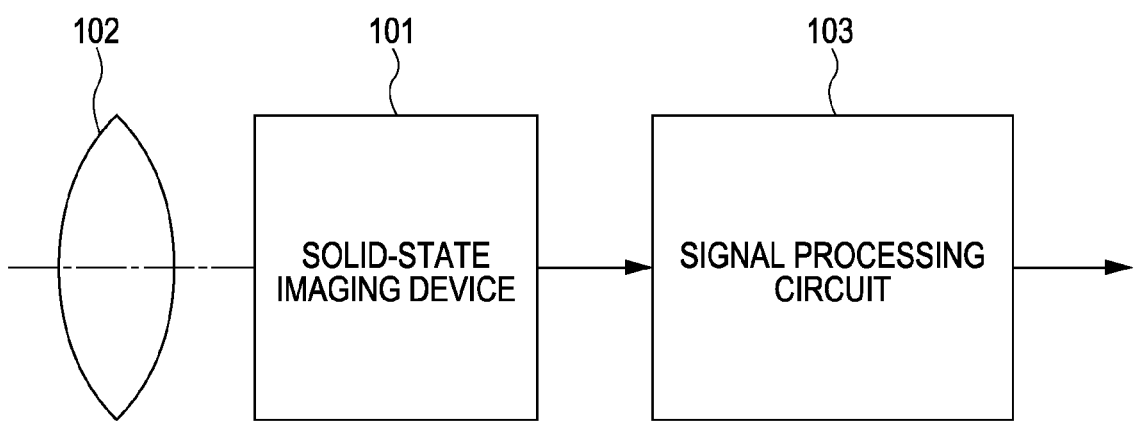
FIG. 10 shows a schematic configuration of a camera.

FIG. 10 is a schematic block diagram of a camera including the solid-state imaging device.

A camera 100 includes the above-described solid-state imaging device 101, an optical system 102, and a signal processing circuit 103. The camera according to an embodiment of the present invention may be a camera module including the solid-state imaging device 101, the optical system 102, and the signal processing circuit 103.

The optical system 102 focuses light (incident light) from a subject on the imaging area of the solid-state imaging device 101. The incident light is converted into a signal charge corresponding to the amount of the incident light in the photodetector 31 of the solid-state imaging device 101. The signal charge is accumulated in the photodetector 31 for a predetermined period of time.

The signal processing circuit 103 performs signal processing of an output signal fed from the solid-state imaging device 101 and outputs an image signal.

The solid-state imaging device according to this embodiment, a method for producing the solid-state imaging device, and advantages of the camera will be described below.

In the solid-state imaging device according to this embodiment, the control gate 52 is disposed on the first surface of the substrate 30 and is superposed on the photodetector 31. The application of a negative voltage to the control gate 52 results in the accumulation of holes in the vicinity of the first surface of the substrate 30, thus reducing dark current.

Thus, even when the hole-accumulation region 44 has a low p-type impurity concentration, the dark current can be suppressed. Hence, the pn junction of the photodetector 31 can be brought close to the first surface side, thereby improving the read ability of the transfer gate 51. The amount of the signal charge that can be read can be increased, thus improving a dynamic range.

To suppress the dark current in the past, it may be necessary to increase the p-type impurity concentration in the hole-accumulation region 44 to about $1 \times 10^{18}/cm^3$. In this embodiment, the p-type impurity concentration in the hole-accumulation region 44 can be reduced to about $1 \times 10^{16}/cm^3$. To further reduce the impurity concentration in the hole-accumulation region 44, a negative voltage applied to the control gate 52 may be increased.

According to the method for producing the solid-state imaging device in accordance with this embodiment described above, the solid-state imaging device including the transfer gate 51 and the control gate 52 can be produced. In particular, when the transfer gate 51 and the control gate 52 are simultaneously formed, the solid-state imaging device can be produced with a small increase in the number of the production steps.

The camera includes the solid-state imaging device described above. Thus, it is possible to produce the camera having low dark current and a wide dynamic range.

Second Embodiment

Figure 11:
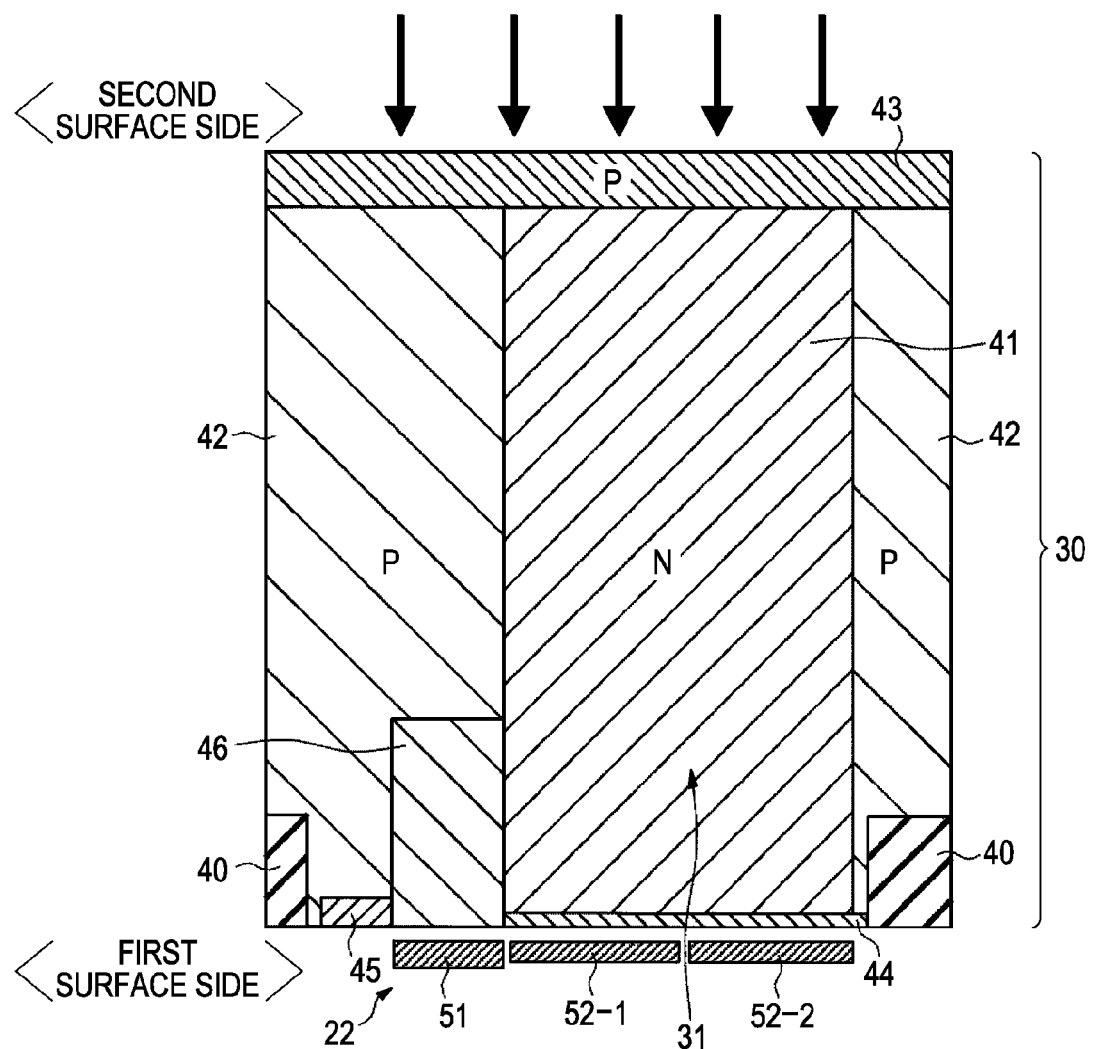
FIG. 11 is a fragmentary cross-sectional view of a substrate of the solid-state imaging device according to the second embodiment.

FIG. 11 is a fragmentary cross-sectional view of the pixel portion of the substrate 30 of a solid-state imaging device according to a second embodiment. The same elements as those in the first embodiment are designated using the same reference numerals, and redundant description is not repeated.

Two control gates, i.e., a first control gate 52-1 and a second control gate 52-2, are formed on the first surface of the substrate 30 with a gate-insulating film (not shown) provided therebetween. The first control gate 52-1 is located between the transfer gate 51 and the second control gate 52-2. The first and second control gates 52-1 and 52-2 are superposed on the photodetector 31. The first and second control gates 52-1 and 52-2 are composed of, for example, polysilicon. Each of the first and second control gates 52-1 and 52-2 preferably has a thickness comparable to the thickness of the transfer gate 51 in view of processability and resistance. Light is incident on the second surface side and thus is not blocked by the first and second control gates 52-1 and 52-2 located on the first surface side. Furthermore, three or more of control gates may be located on the photodetector 31.

The solid-state imaging device described above is produced in the same way as in the first embodiment. For example, the transfer gate 51 and the first and second control gates 52-1 and 52-2 may be simultaneously formed in the same way as in first embodiment. Alternatively, after the formation of the first control gate 52-1, a silicon oxide film is formed on the surface of the first control gate 52-1 by oxidation, and then the transfer gate 51 and the second control gate 52-2 may be formed on either side of the first control gate 52-1.

Operations of the solid-state imaging device according to this embodiment will be described below with reference to FIGS. 11 and 12. FIG. 12 is a table showing an example of bias during operations of the solid-state imaging device.

In a period of charge accumulation, light is incident in the direction indicated by the arrows shown in the figure and is then photoelectrically converted by the photodetector (photodiode) 31 to generate a signal charge in response to the amount of the incident light. The signal charge drifts in the charge-accumulation region 41 and is accumulated in the charge-accumulation region 41 in the vicinity of the hole-accumulation region 44. The application of a negative voltage to the transfer gate 51 in the period of charge accumulation results in an OFF state of the transfer transistor 22. The application of a negative voltage to the first and second control gates 52-1 and 52-2 results in the accumulation of holes in the vicinity of the interface (first surface) of the substrate 30, thus reducing dark current.

The negative voltage applied to the first and second control gates 52-1 and 52-2 varies in response to the impurity concentration below the control gate 52 and the thickness of the gate oxide film. For example, in the case where the hole-accumulation region 44 having a p-type impurity concentration of $1 \times 10^{16}/cm^3$ is formed by a 0.25-μm-generation process, the application of a voltage of about −1 V can sufficiently inhibit the generation of dark current. The signal charge is accumulated in the charge-accumulation region 41 in the vicinity of the hole-accumulation region 44.

In a read operation (read 1), a positive voltage (for example, about +1 V) is applied to the first control gate 52-1. Thus, the signal charge in the charge-accumulation region 41 collects under the first control gate 52-1 on the same principle as CCDs.

A positive voltage is applied to the transfer gate 51. A negative voltage is applied to the first control gate 52-1 (see read 2), resulting in an ON state of the transfer transistor 22. The signal charge collected under the first control gate 52-1 is transferred to the floating diffusion region 45. The positive voltage applied to the transfer gate 51 is equal to, for example, a power supply voltage (3.3 V or 2.7 V). The application of the negative voltage to the first control gate 52-1 results in the application of an electric field to the substrate 30 in the horizontal direction, thus efficiently transferring the signal charge to the floating diffusion region 45.

The potential of the floating diffusion region 45 varies in accordance with the amount of the signal charge transferred. The potential of the floating diffusion region 45 is amplified by the amplifying transistor 23. A voltage in response to the potential is outputted to the vertical signal line 27 (see FIG. 2).

In a reset operation, the application of a positive voltage to the gate of the reset transistor 25 resets the voltage of the floating diffusion region 45 to the voltage of the power supply Vdd. In this case, a negative voltage is applied to the transfer gate 51, resulting in an OFF state of the transfer transistor 22. Furthermore, a negative voltage is applied to the first and second control gates 52-1 and 52-2.

The accumulation operation, the read operation, and the reset operation described above are repeated.

In this embodiment, the plurality of first and second control gates 52-1 and 52-2 are formed on the photodetector 31. The sequential turning-ON/OFF of the first and second control gates 52-1 and 52-2 results in the generation of electric field in the horizontal direction, thus efficiently transferring the charge.

From the standpoint of the efficient readout of the charge, in the past, when an electric filed is horizontally generated in the substrate 30, it may be necessary to change the impurity concentration in the charge-accumulation region 41 in the horizontal direction. In this case, the potential well is shallow in a region where the impurity concentration of the charge-accumulation region 41 is low, thus reducing the amount of the charge accumulated and the dynamic range. In this embodiment, a concentration gradient in the horizontal direction is not required; hence, no reduction in dynamic range is observed. This embodiment is particularly effective for solid-state imaging devices including large pixels.

According to the method for producing the solid-state imaging device, the solid-state imaging device including the transfer gate 51 and the first and second control gates 52-1 and 52-2 can be produced. In particular, when the transfer gate 51 and the first and second control gates 52-1 and 52-2 are simultaneously formed, the solid-state imaging device can be produced with a small increase in the number of the production steps.

The camera includes the solid-state imaging device described above. Thus, it is possible to produce the camera having low dark current and a wide dynamic range.

Third Embodiment

Figure 13:
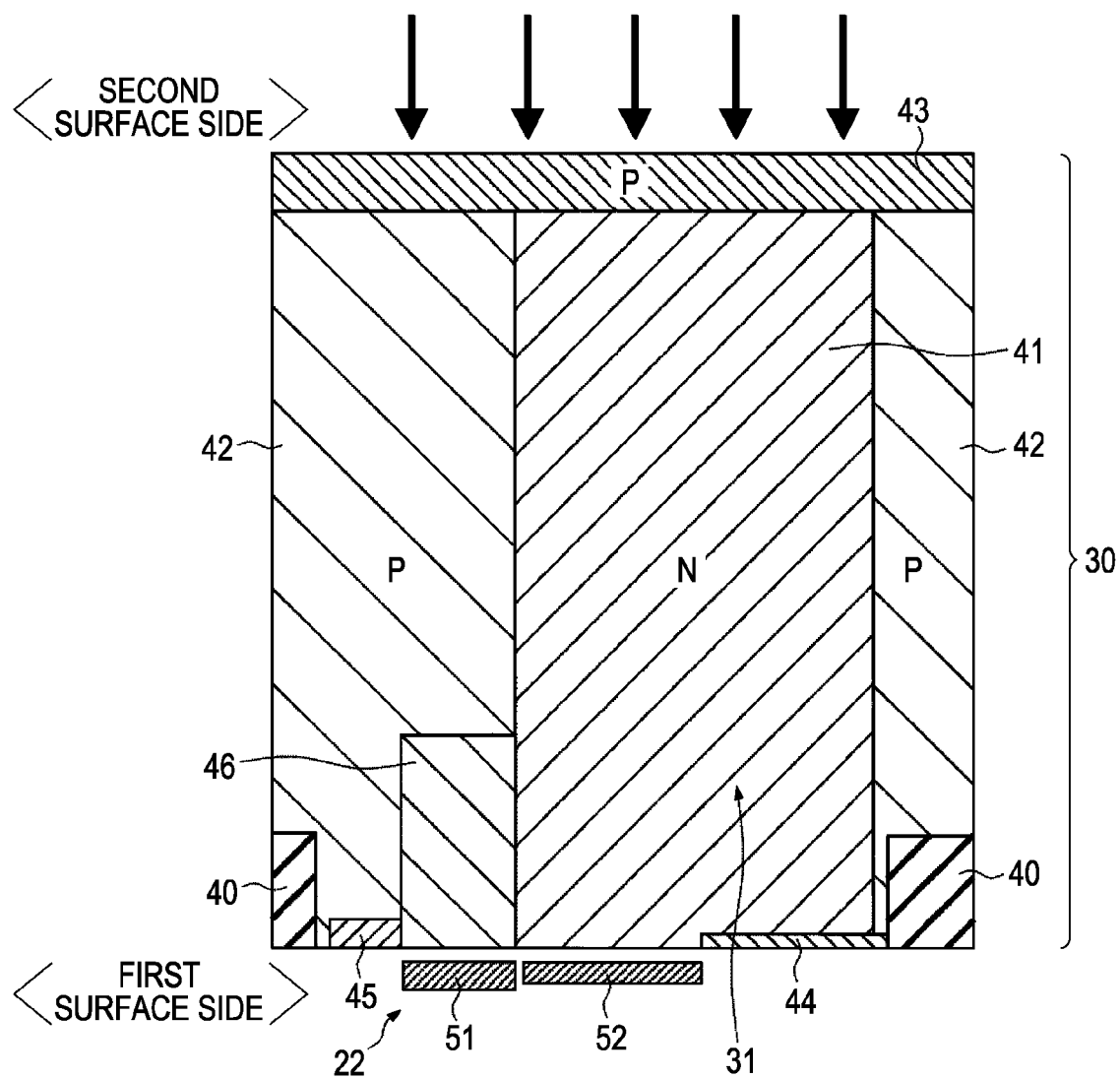
FIG. 13 is a fragmentary cross-sectional view of a substrate of the solid-state imaging device according to the third embodiment.

FIG. 13 is a fragmentary cross-sectional view of the pixel portion of the substrate 30 of a solid-state imaging device according to a third embodiment. The same elements as those in the first embodiment are designated using the same reference numerals, and redundant description is not repeated.

The control gate 52 is formed on the first surface of the substrate 30 with a gate-insulating film (not shown) provided therebetween. In this embodiment, the control gate 52 partially overlaps the photodetector 31. The hole-accumulation region 44 is not formed under the control gate 52. That is, a region where only the control gate 52 is located next to the transfer gate 51 and a region where only the hole-accumulation region 44 is located are formed. Alternatively, the hole-accumulation region 44 may be formed on the entire surface of the photodetector 31. Furthermore, the control gate 52 and the hole-accumulation region 44 may be inversely arranged.

The above-described solid-state imaging device is produced in the same way as in the first embodiment. For example, the transfer gate 51 and the control gate 52 may be simultaneously formed in the same way as in first embodiment. Alternatively, after the formation of the control gate 52, a silicon oxide film is formed on the surface of the control gate 52 by oxidation, and then the transfer gate 51 may be formed. Alternatively, the transfer gate 51 is formed, and after a silicon oxide film may be formed on the side wall of the transfer gate 51 by oxidation, the control gate 52 may be formed. The hole-accumulation region 44 may be formed before the transfer gate 51 and the control gate 52 are formed. Alternatively, the hole-accumulation region 44 may be formed by ion implantation with the transfer gate 51 and the control gate 52 as a mask.

Operations of the solid-state imaging device according to this embodiment will be described below with reference to FIG. 13. An example of bias during operations of the solid-state imaging device is the same as in the first embodiment (see FIG. 5).

In a period of charge accumulation, light is incident in the direction indicated by the arrows shown in the figure and is then photoelectrically converted by the photodetector (photodiode) 31 to generate a signal charge in response to the amount of the incident light. The signal charge drifts in the charge-accumulation region 41 and is accumulated on the first surface side of the charge-accumulation region 41. The application of a negative voltage to the transfer gate 51 in the period of charge accumulation results in an OFF state of the transfer transistor 22. A negative voltage is applied to the control gate 52. Holes are accumulated in the vicinity of the first surface of the photodetector 31 by virtue of the hole-accumulation region 44 and the control gate 52, thus reducing dark current.

In a read operation, the application of a positive voltage to the transfer gate 51 results in an ON state of the transfer transistor 22. The signal charge accumulated in the photodetector 31 is transferred to the floating diffusion region 45. The positive voltage is equal to, for example, a power supply voltage (3.3 V or 2.7 V).

In the read operation, the same negative voltage (for example, −1 V) as in the accumulation is basically applied to the control gate 52. Alternatively, in the read operation, a positive voltage of about +1 V may be applied to the control gate 52. In this case, the signal charge approaches the first surface side, thus improving the read ability of the transfer gate 51. A period of time required for readout is very shorter than the accumulation period. Thus, dark current due to the application of the positive voltage to the control gate 52 is low.

The potential of the floating diffusion region 45 varies in accordance with the amount of the signal charge transferred. The potential of the floating diffusion region 45 is amplified by the amplifying transistor 23. A voltage in response to the potential is outputted to the vertical signal line 27 (see FIG. 2).

In a reset operation, the application of a positive voltage to the gate of the reset transistor 25 resets the voltage of the floating diffusion region 45 to the voltage of the power supply Vdd. In this case, a negative voltage is applied to the transfer gate 51, resulting in an OFF state of the transfer transistor 22. Furthermore, a negative voltage is applied to the control gate 52.

The accumulation operation, the read operation, and the reset operation described above are repeated.

According to the solid-state imaging device in accordance with this embodiment, even when the control gate 52 partially overlaps the photodetector 31, it is possible to achieve the same effect as in the first embodiment, i.e., it is possible to reduce the dark current and to improve the read ability. Furthermore, the hole-accumulation region 44 can be formed in only a part of the photodetector 31 by providing the control gate 52.

When the hole-accumulation region 44 is formed in only a part of the photodetector 31, the hole-accumulation region 44 can be formed in a self-aligned manner by ion implantation with the transfer gates 51 and the control gate 52 as a mask. The hole-accumulation region 44 may be formed on the entire surface of the photodetector 31.

The camera includes the solid-state imaging device described above. Thus, it is possible to produce the camera having low dark current and a wide dynamic range.

According to the first to third embodiments described above, it is possible to produce the solid-state imaging device and the camera each having low dark current and an improved read ability.

Fourth Embodiment

Figure 14:
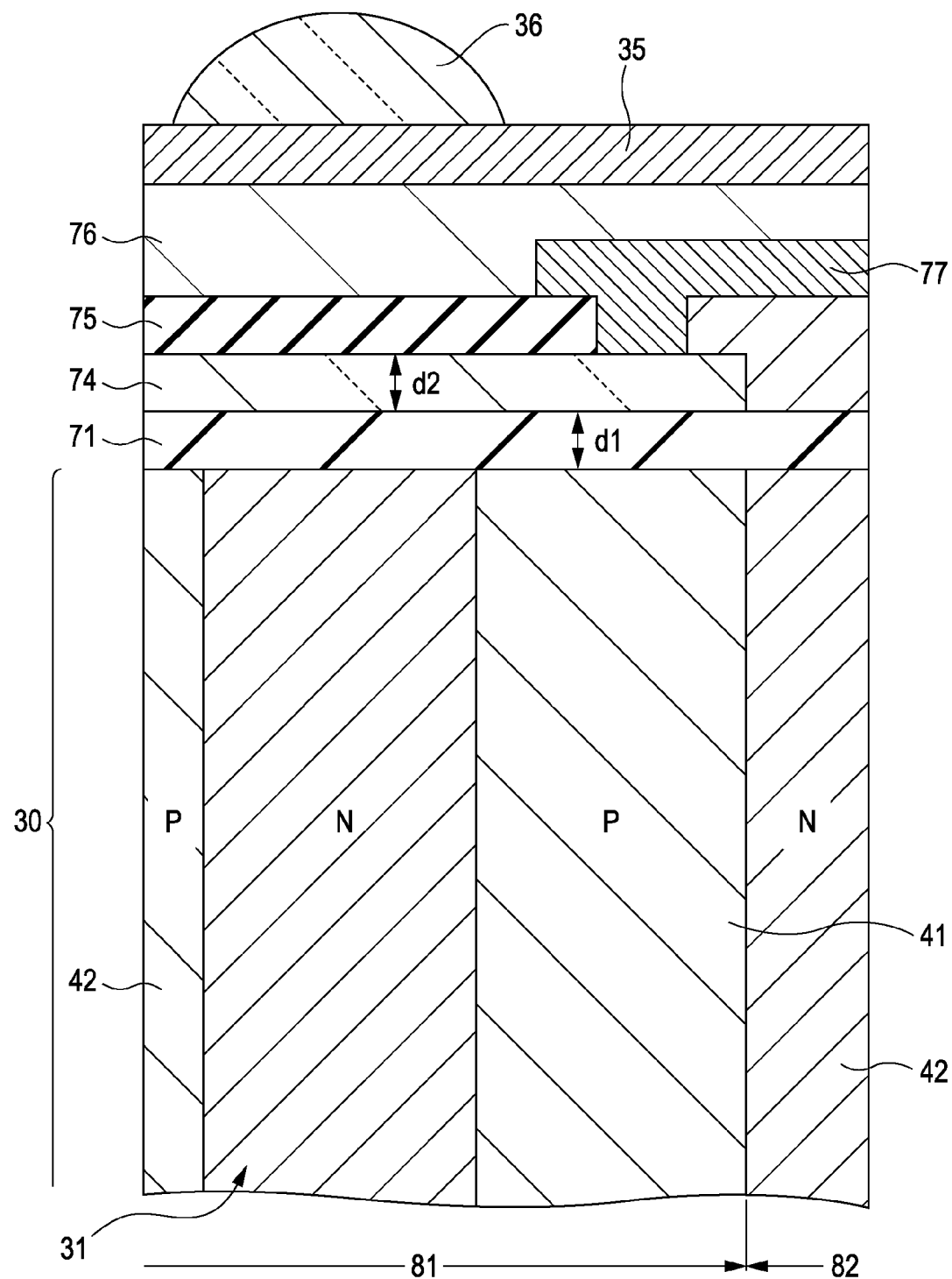
FIG. 14 is a fragmentary cross-sectional view of a substrate of the solid-state imaging device according to the fourth embodiment.

FIG. 14 is a fragmentary cross-sectional view of the pixel portion of a solid-state imaging device according to a fourth embodiment. The same elements as those in the first embodiment are designated using the same reference numerals, and redundant description is not repeated.

The solid-state imaging device according to this embodiment includes a transparent conductive film 74 on the light-receiving surface of the photodetector 31 constituting a photodiode as a photoelectric converter, i.e., on the light-receiving surface of the region (n-type charge-accumulation region) 41 of a first conductivity type, with a single-layer insulating film 71 provided therebetween. The solid-state imaging device is configured in such a manner that a negative voltage is applied to the transparent conductive film 74. The transparent conductive film 74 functions as a control gate that controls the potential of the light-receiving surface. The transparent conductive film 74 is overlaid with a planarizing film 76 with an insulating film, such as a silicon oxide film 75, provided therebetween. The planarizing film 76 is overlaid with the color filter 35. The color filter 35 is overlaid with the on-chip microlens 36. The transparent conductive film 74 is connected to a lead 77 (also functions as a light-shading film) through the silicon oxide film 75. The lead 77 extends from an imaging portion 81 (corresponding to pixel portion 11) to a peripheral circuit portion 82.

In this embodiment, the thickness d1 of the insulating film 71 under the transparent conductive film 74, i.e., the thickness d1 of the silicon oxide film in this embodiment, is set at 50 nm or less in order that this structure having the transparent conductive film 74 advantageously has an excellent absorption coefficient of light in the photodiode. Preferably, the thickness d1 of the silicon oxide film, which is the insulating film 71, is set at 50 nm or less, and the thickness d2 of the transparent conductive film 74 is optimized in response to the thickness d1 of the silicon oxide film. The insulating film 71 may be a silicon oxynitride film as well as the silicon oxide film.

In the case where the transparent conductive film 74 is an oxide film containing indium and tin, i.e., indium-tin-oxide (ITO) film, an antireflective film constituted by the transparent conductive film (ITO film) 74 and the insulating film (silicon oxide film) 71 is formed because the transparent conductive film (ITO film) 74 has a refractive index of about 2.0 and the insulating film (silicon oxide film) 71 has a refractive index of about 1.45. The transparent conductive film 74 may be an oxide film containing zinc, i.e., a zinc oxide film, as well as the ITO film.

The thickness d1 of the insulating film 71 may be 50 nm or less, in the range of 1.0 nm to 50 nm, preferably 30 nm or less, and more preferably 15 nm to 30 nm. A thinner thickness d1 of the insulating film 71 improves transmittance when the silicon oxide film (thickness d1) and the ITO film (thickness d2) are optimized, thus resulting in higher sensitivity of the solid-state imaging device. A thickness exceeding 50 nm increases a reflection component. A thickness of less than 1.0 nm degrades insulating properties.

According to the fourth embodiment, the transparent conductive film 74 is formed on the light-receiving surface of the photodetector 31 constituting a photodiode with the insulating film 71, having a single-layer structure, provided therebetween. The application of a negative voltage to the transparent conductive film 74 results in a hole accumulation state on the surface of the photodiode. In other words, holes are accumulated on the surface of the photodiode, thereby suppressing a dark current component due to an interface state. Furthermore, when the a thickness d1 of the insulating film 71 having a refractive index lower than that of the transparent conductive film 74 is set at 50 nm or less, the insulating film 71 being disposed under the transparent conductive film 74, the antireflective film constituted by the transparent conductive film 74 and the insulating film 71 is formed. Hence, even when the transparent conductive film 74 is disposed, sensitivity is not reduced. Thus, according to this embodiment, it is possible to produce the solid-state imaging device having low dark current and high sensitivity.

It is possible to suppress the dark current due to the interface by forming a transparent conductive film on the surface of a photodiode with an insulating film provided therebetween and applying a negative voltage to the transparent conductive film to form a hole accumulation state on the surface of the photodiode, in the same way as in the buried photodiode. However, there are disadvantages in this structure. The formation of the transparent conductive film increases the number of layers stacked on the photodiode, thereby increasing a reflection component reflected from the interface between upper layers or increasing the absorption of light having shorter wavelengths in the transparent conductive film, such as an ITO film. Although the dark current can be reduced, sensitivity may be degraded due to these optical disadvantages.

In contrast, according to this embodiment, the thickness d1 of the single-layer insulating film 71, such as the silicon oxide film or the silicon oxynitride film, under the transparent conductive film 74 is set at 50 nm or less, and then the thickness d2 of the transparent conductive film 74 is optimized in response to the thickness d1, thereby achieving a balance between the suppression of the dark current at the interface and the improvement of sensitivity.

Specifically, when the thickness of the insulating film 71 (silicon oxide film in this embodiment) under the transparent conductive film 74 is set at 50 nm or less, the superiority in the absorption coefficient of light in the photodiode is verified with reference to FIGS. 15 to 19.

Figure 15:
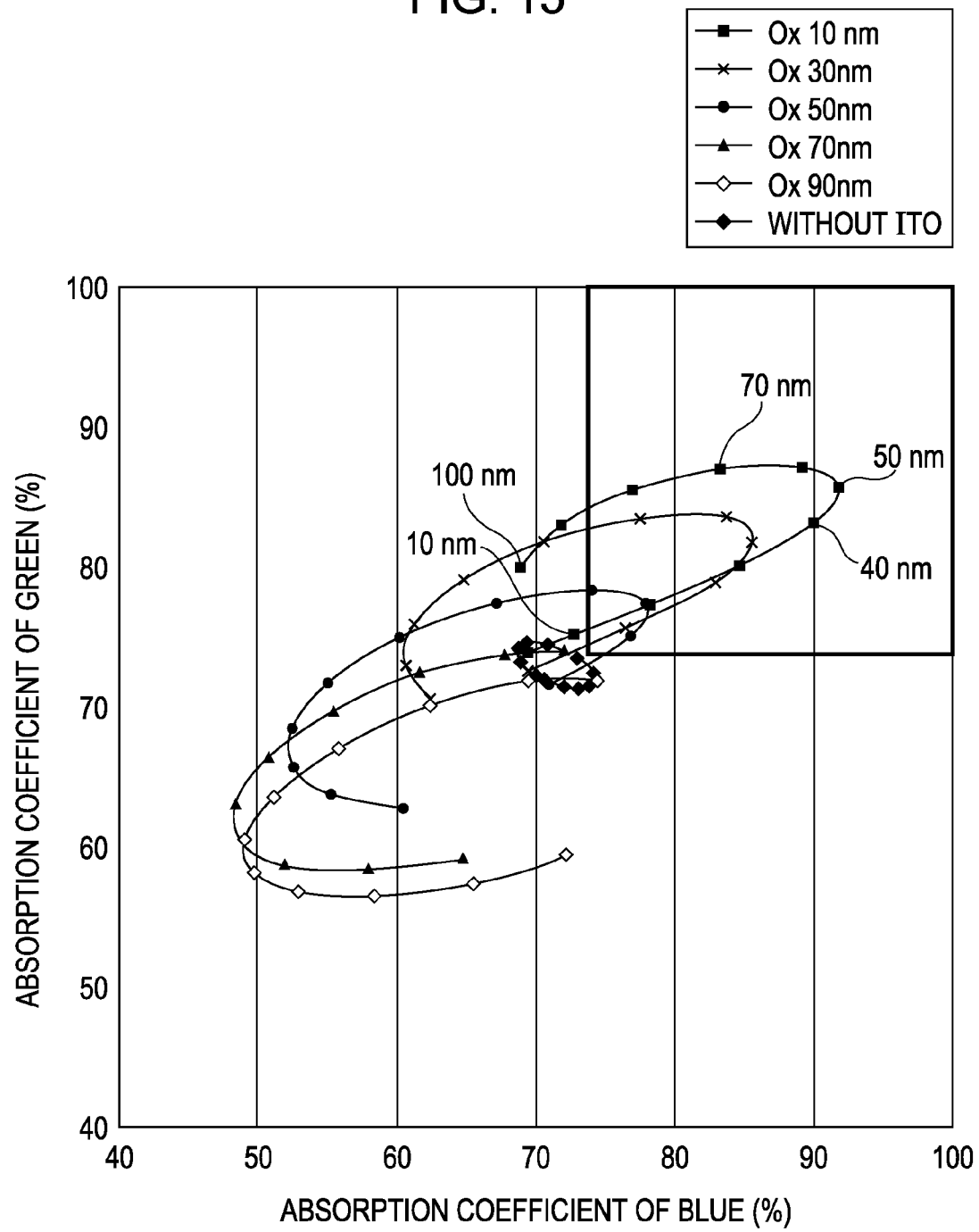
FIG. 15 is a graph illustrating absorption coefficients of blue light and green light in the photodiode of the solid-state imaging device according to the fourth embodiment, the absorption coefficient being determined by a simulation.

A device structure, shown in FIG. 14, including the transparent conductive film (ITO film) 74 on the insulating film (silicon oxide film) 71 will be discussed. FIG. 15 is a graph showing the absorption coefficient of light in the photodiode, the absorption coefficient being determined by a simulation with the thickness d2 of the transparent conductive film (ITO film) 74 and the thickness d1 of the insulating film (silicon oxide film) 71 as parameters.

In FIG. 15, the depth of the photodiode is assumed to be 4 μm. The horizontal axis indicates the absorption coefficient of 450-nm light in the photodiode, the switching circuit being assumed to be blue. The longitudinal axis indicates the absorption coefficient of 550-nm light in the photodiode, the absorption coefficient being assumed to be green. Both absorption coefficients are plotted. The term "Ox" shown in legends in the figure means the thickness of the silicon oxide film which is the insulating film disposed under the transparent conductive film (ITO film) 74. With respect to the thickness of the silicon oxide film indicated by the curved lines (thin lines) in the figure, the thickness of the ITO film is changed from 0 nm to 100 nm in 10 nm steps. The curved line of the term "without ITO" in the legends means data in the case where the thickness of the silicon oxide film alone is changed from 0 nm to 200 nm and no ITO film is formed.

The upper films disposed above the transparent conductive film (ITO film) are fixed. The insulating film (silicon oxide film) 75 disposed on the transparent conductive film (ITO film) 74 is assumed to be 100 nm in thickness. The planarizing film 76 is assumed to be composed of a material containing silicon (Si), oxygen (O), and carbon (C), having a refractive index of 1.5, and having a thickness of 1 µm. The color filter 35 is assumed to be composed of a material having a refractive index of about 1.6 to 1.7.

FIG. 15 shows the presence of the optimum thickness d2 of the ITO film in response to the thickness d1 of the insulating film (silicon oxide film) disposed under the transparent conductive film (ITO film) 74 in order to achieve a balance between absorption coefficients of blue light and green light. The graph demonstrated that even when the optimum thickness of the ITO film is set, the maximum absorption coefficients of blue light and green light depend on the thickness d1 of the silicon oxide film disposed under the ITO film. The absorption coefficient of light in the photodiode is preferably present within the frame represented by a solid line (the range in which the absorption coefficient of each of blue light and green light in the photodiode is about 73% or more). More preferably, absorption coefficients of blue light and green light are each 80% or more. In the structure having the ITO film in contrast to the structure having the silicon oxide film without the ITO film, at least the silicon oxide film disposed under the ITO film may be required to have a thickness d1 of 50 nm or less in order to hold the superiority in the absorption coefficient of light in the photodiode. The ITO film preferably has a thickness of 30 nm or less in order that the structure including the ITO film has the superiority in the absorption coefficient of light in the photodiode over the structure not including the ITO film.

Figure 16:
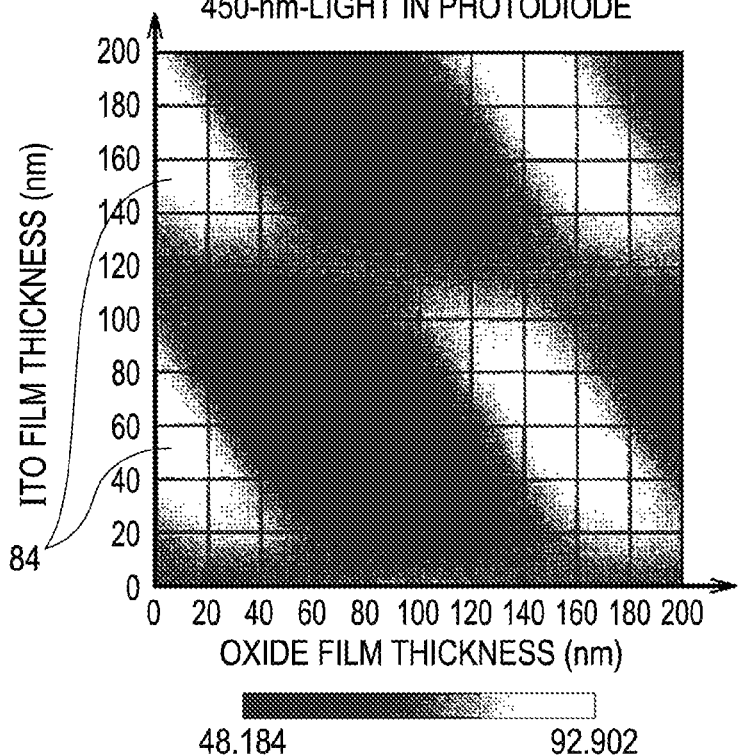
FIG. 16 is an intensity graph illustrating the absorption coefficient of light having a wavelength of 450 nm in the photodiode of the solid-state imaging device according to the fourth embodiment.
Figure 17:
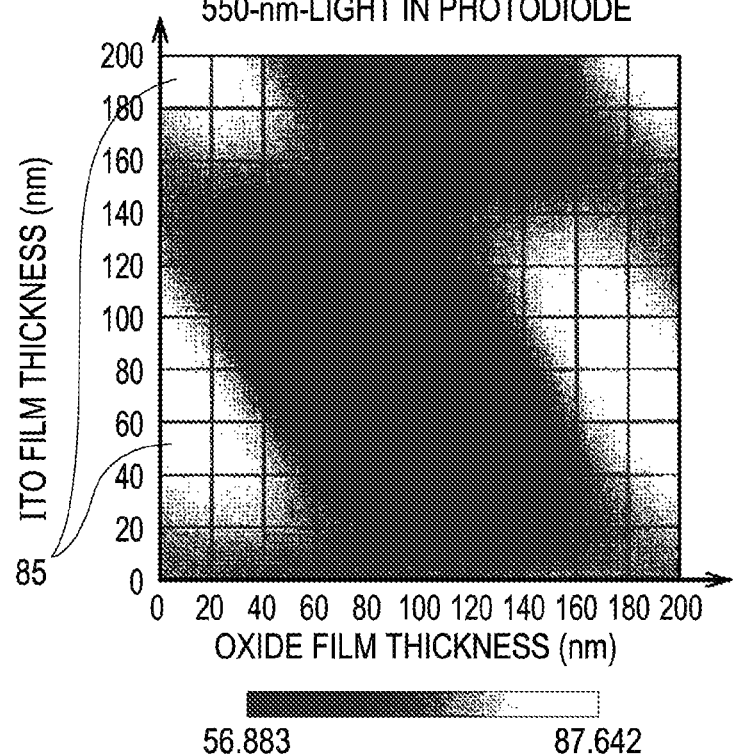
FIG. 17 is an intensity graph illustrating the absorption coefficient of light having a wavelength of 550 nm in the photodiode of the solid-state imaging device according to the fourth embodiment.

FIGS. 16 and 17 are each an intensity graph showing absorption coefficients of blue light and green light in the photodiode, the thickness d1 of the silicon oxide film disposed under the ITO film and the thickness d2 of the ITO film being changed. FIG. 16 shows the absorption coefficient of blue light having a wavelength of 450 nm in the photodiode. FIG. 17 shows the absorption coefficient of green light having a wavelength of 550 nm in the photodiode. FIGS. 16 and 17 shows that a smaller thickness d1 of the silicon oxide film disposed under the ITO film is preferred in order to increase the absorption coefficients of both blue light and green light. In FIGS. 16 and 17, the white regions 84 and 85 are optimum regions.

Furthermore, FIG. 18 is a graph showing absorption coefficients of blue light and green light in the photodiode, the thickness d1 of the silicon oxide film disposed under the ITO film being 20 nm. FIG. 19 is a graph showing the absorption coefficient of blue light and green light in the photodiode, the thickness d1 of the silicon oxide film disposed under the ITO film being 160 nm. When the thickness d1 of the silicon oxide film shown in FIG. 19 is 160 nm, the peak value for blue light of the thickness d2 of the ITO film is different from the peak value for green light of the thickness d2. That is, the absorption coefficients of blue light and green light are not well-balanced. On the other hand, as shown in FIG. 18, when the thickness d1 of the silicon oxide film is small, a balance between the absorption coefficients of blue light and green light is achieved by optimizing the thickness d2 of the ITO film.

According to this embodiment of the present invention, a camera including the solid-state imaging device according to the fourth embodiment can have low dark current and improved sensitivity.

In the fourth embodiment, the silicon oxide film or silicon oxynitride film that is a single-layer structure is formed as the insulating film 71 under the transparent conductive film 74. Alternatively, a stacked film including at least two types of sub-film may be formed as the insulating film. An embodiment of this case will be described below.

Fifth Embodiment

FIG. 20 is a fragmentary cross-sectional view of the pixel portion of a solid-state imaging device according to a fifth embodiment. Also in this embodiment, the solid-state imaging device is of a backside-illumination type. The same elements as those in the first embodiment are designated using the same reference numerals, and redundant description is not repeated.

The solid-state imaging device according to this embodiment includes a transparent conductive film 74 on the light-receiving surface of the photodetector 31 constituting a photodiode as a photoelectric converter, i.e., on the light-receiving surface of the region (n-type charge-accumulation region) 41 of a first conductivity type, with a stacked insulating film 83 provided therebetween, the stacked insulating film 83. In this embodiment, the stacked insulating film 83 has a two-layer structure including a lower insulating sub-film 72 (silicon oxide ($SiO_2$) sub-film) and an upper insulating sub-film 73 (silicon nitride (SiN) sub-film). The solid-state imaging device is configured in such a manner that a negative voltage is applied to the transparent conductive film 74. The transparent conductive film 74 functions as a control gate that controls the potential of the light-receiving surface. The lower insulation sub-film (silicon oxide film) 72 is formed in contact with the light-receiving surface of the photodetector. The transparent conductive film 74 is overlaid with a planarizing film 76 with an insulating film, such as a silicon oxide film 75, provided therebetween. The planarizing film 76 is overlaid with the color filter 35. The color filter 35 is overlaid with the on-chip microlens 36. The transparent conductive film 74 is connected to a lead 77 (also functions as a light-shading film) through the silicon oxide film 75. The lead 77 extends from an imaging portion 81 (corresponding to pixel portion 11) to a peripheral circuit portion 82.

Among the two insulating sub-films 72 and 73, the upper insulating sub-film (silicon nitride sub-film) 73 has a refractive index of about 2.0. The transparent conductive film 74, such as the ITO film, has a refractive index of about 2.0. Thus, the upper insulating sub-film has substantially the same optical properties as those of the transparent conductive film. Hence, the thickness d2 of the transparent conductive film (ITO film) 74 is effectively regarded as the total thickness of the transparent conductive film (ITO film) 74 and the upper insulating sub-film (silicon nitride sub-film) 73 that have substantially the same refractive index. A hafnium oxide ($HfO_2$) sub-film having a refractive index of about 2.0 may be used as the upper insulating sub-film 73 in place of the silicon nitride sub-film.

In this embodiment, the thickness d1 of the lower insulating sub-film (silicon oxide sub-film) 72 under the transparent conductive film 74 is set at 50 nm or less as in the fourth embodiment. Preferably, the thickness d1 of the lower insulating sub-film (silicon oxide sub-film) 72 is set at 50 nm or less, and the effective thickness d2 of the transparent conductive film is optimized in response to the thickness d1 of the insulating sub-film (silicon oxide sub-film). A silicon oxynitride sub-film may be used as the lower insulating sub-film 72 in place of the silicon oxide sub-film. The zinc oxide film may also be used as the transparent conductive film 74 as well as the ITO film.

When the upper insulating sub-film 73 is the hafnium oxide ($HfO_2$ sub-film), the thickness d1 of the lower insulating sub-film (silicon oxide sub-film) 72 can be reduced to about 0.5 nm. Thus, the thickness d1 may be 50 nm or less, in the range of 1.0 nm to 50 nm, preferably 30 nm or less, and more preferably 15 nm to 30 nm.

When data as shown in FIG. 15 is measured for the structure including the stacked insulating film 83 according to this embodiment, the thickness d2 of the ITO film is effectively regarded as the total thickness of the ITO film 74 and the upper insulating sub-film 73 composed of silicon nitride or hafnium oxide. Thus, also in the fifth embodiment, the same tendency as in FIG. 15 is observed.

According to the fifth embodiment, the transparent conductive film 74 is formed on the light-receiving surface of the photodetector 31 constituting a photodiode with the stacked insulating film 83 provided therebetween, the stacked insulating film 83 including the lower insulating sub-film 72 composed of silicon oxide, as in the fourth embodiment. The application of a negative voltage to the transparent conductive film 74 results in a hole accumulation state on the surface of the photodiode. In other words, holes are accumulated on the surface of the photodiode, thereby suppressing a dark current component due to the interface state. Furthermore, in the case where the thickness d1 of the silicon oxide sub-film under the transparent conductive film 74 is set at 50 nm or less, even when the transparent conductive film 74 is used, sensitivity is not reduced. Thus, it is possible to produce the solid-state imaging device having low dark current and high sensitivity.

According to this embodiment of the present invention, a camera including the solid-state imaging device according to the fifth embodiment can have low dark current and improved sensitivity.

FIGS. 21A to 22G show an embodiment of a method for producing the solid-state imaging device according to the fourth embodiment. FIGS. 21A to 22G are each a schematic cross-sectional view showing the imaging portion 81 and the peripheral circuit portion 82.

Figure 21A:
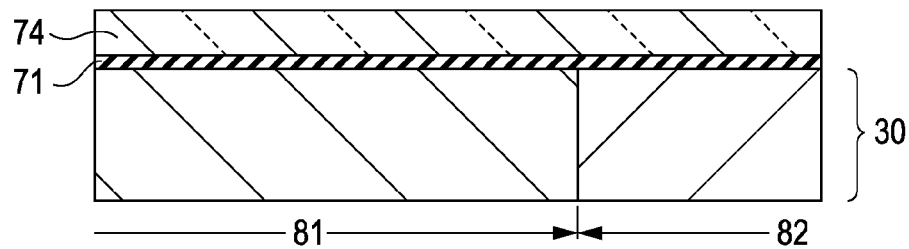
FIGS. 21A to 21D are each a process drawing (1) illustrating a method for producing the solid-state imaging device according to the fourth embodiment.

As shown in FIG. 21A, the single-layer insulating film 71 having a predetermined thickness and the transparent conductive film 74 having a predetermined thickness are stacked on the back surface of the substrate 30 including a pixel having a photodiode and a wiring layer in the imaging portion 81 and predetermined peripheral circuitry in the peripheral circuit portion 82, the insulating film 71 and the transparent conductive film 74 being disposed on the entire surface of the photodiode and the peripheral circuitry side. The insulating film 71 preferably has a small thickness.

In this embodiment, the insulating film (silicon oxide film) 71 having a single-layer structure and a thickness of 15 nm is formed in view of the withstand voltage and the absorption coefficient. An ITO film as the transparent conductive film 74 having a thickness of 50 nm is formed on the insulating film (silicon oxide film) 71. The silicon oxide film as the insulating film 71 may be formed by, for example, plasma-enhanced CVD with $SiH_4$ and $O_2$ as source gases or plasma-enhanced CVD with tetraethoxysilane (TEOS). The ITO film as the transparent conductive film 74 may be formed by sputtering with an ITO target. In this case, the thickness d2 of the transparent conductive film (ITO film) 74 may need to be optimized in response to the thickness d1 of the lower insulating film (silicon oxide film) 71. As described above, the thickness d1 of the insulating film (silicon oxide film) is 15 nm. Thus, the thickness of the transparent conductive film (ITO film) 74 is optimized to 50 nm in response to the thickness d1. Of course, when the thickness d1 of the silicon oxide film is changed, the thickness d2 of the ITO film is also changed in response to the thickness d1.

Figure 21B:
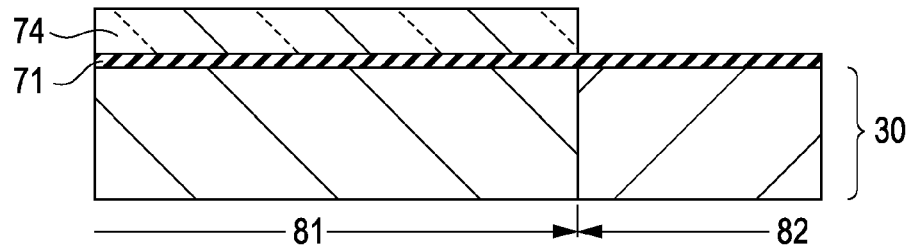

As shown in FIG. 21B, the ITO film 74 is selectively etched to leave the ITO film 74 on a desired portion, i.e., on only the imaging portion 81 where the pixel is formed.

Figure 21C:
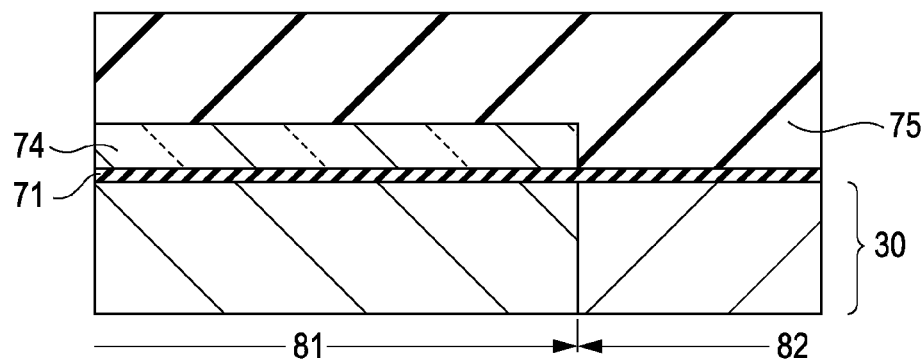

As shown in FIG. 21C, the insulating film (silicon oxide film) 75 having a predetermined thickness is formed on the entire surface of the transparent conductive film (ITO film) 74 and the peripheral circuit portion 82 side. In this embodiment, the insulating film (silicon oxide film) 75 having a thickness of about 150 nm is formed by plasma-enhanced CVD.

Figure 21D:
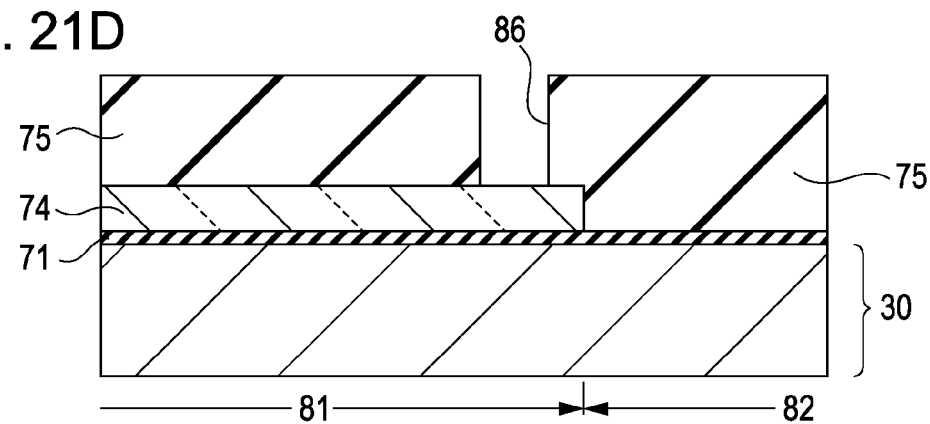

As shown in FIG. 21D, a contact hole 86 for a lead that applies a bias voltage to the transparent conductive film (ITO film) 74 is formed in the insulating film (silicon oxide film) 75.

Figure 22E:
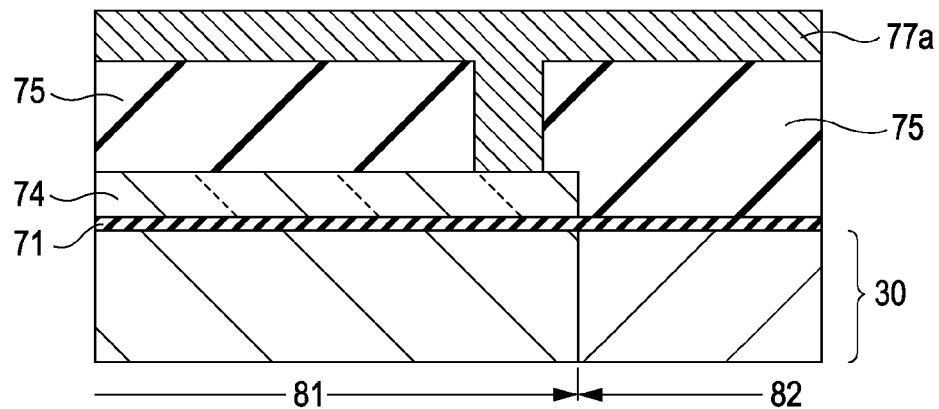
FIGS. 22E to 22G are each a process drawing (2) illustrating a method for producing the solid-state imaging device according to the fourth embodiment.

As shown in FIG. 22E, a metal film 77a functioning as a light-shading film and a lead is formed on the entire surface including the contact hole 86. The metal film 77a may have a multilayer structure. The multilayer structure may be an Al/TiN/Ti structure, the uppermost layer being composed of Al.

Figure 22F:
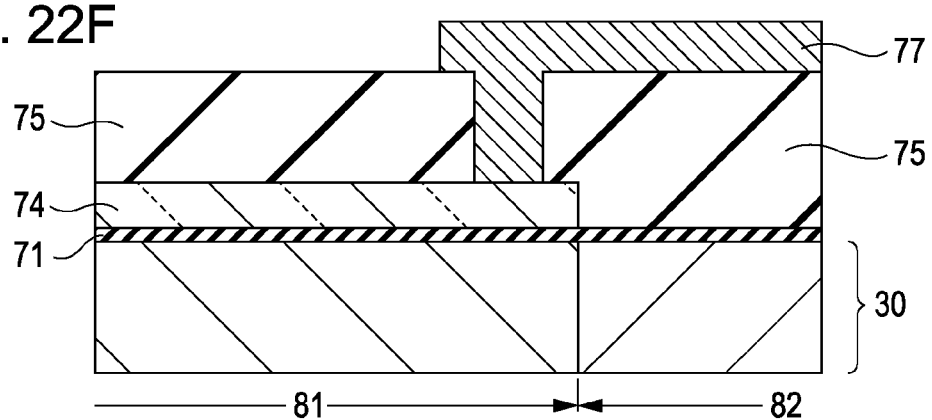

As shown in FIG. 22F, the metal film 77a is patterned to form the lead 77 extending toward the peripheral circuit portion 82 and also functioning as a light-shading film.

Figure 22G:
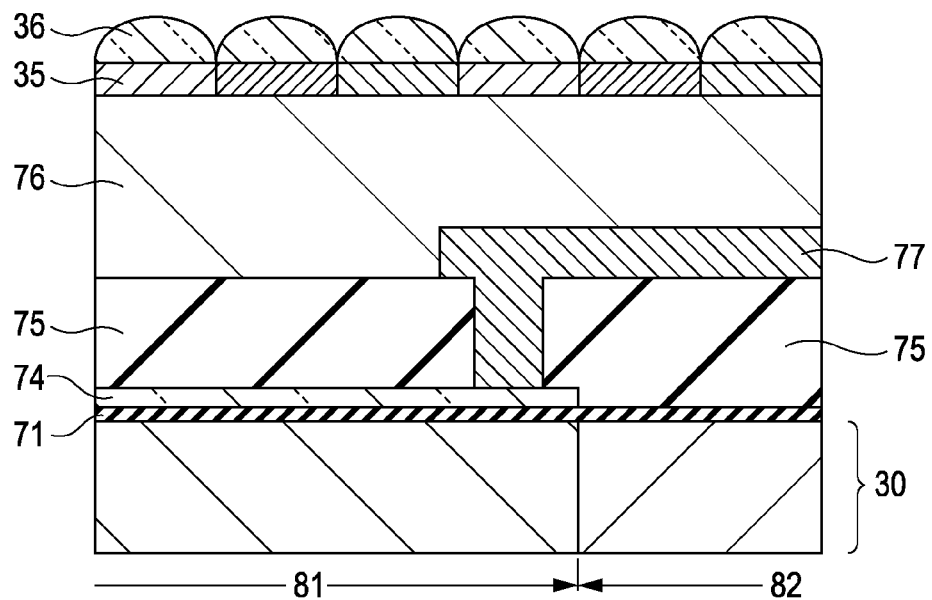

As shown in FIG. 22G, the planarizing film 76 having a predetermined thickness is formed on the entire surface. In this embodiment, an insulating material mainly composed of silicon (Si), oxygen (O), and carbon (C) is applied in such a manner that the resulting film has a thickness of about 1 μm, and then the resulting film is annealed to form the planarizing film 76. The color filter 35 is formed on the planarizing film 76. Furthermore, the on-chip microlens 36 for collecting light is formed thereon. Thereby, the target solid-state imaging device according to the fourth embodiment is produced.

FIGS. 23A to 24G show an embodiment of a method for producing the solid-state imaging device according to the fifth embodiment. FIGS. 23A to 24G are each a schematic cross-sectional view showing the imaging portion 81 and the peripheral circuit portion 82.

Figure 23A:
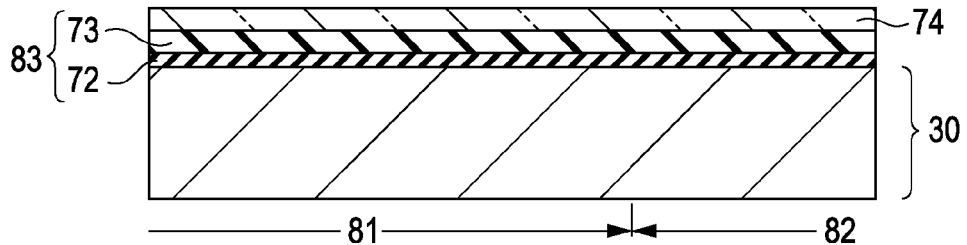
FIGS. 23A to 23D are each a process drawing (1) illustrating a method for producing the solid-state imaging device according to the fifth embodiment.

As shown in FIG. 23A, the stacked insulating film 83 having a predetermined thickness and the transparent conductive film 74 having a predetermined thickness are stacked on the back surface of the substrate 30 including a pixel having a photodiode and a wiring layer in the imaging portion 81 and predetermined peripheral circuitry in the peripheral circuit portion 82, the stacked insulating film 83 and the transparent conductive film 74 being disposed on the entire surface of the photodiode and the peripheral circuitry side.

In this embodiment, the silicon oxide sub-film as the lower insulating sub-film 72 having a thickness of about 15 nm is formed. The silicon nitride sub-film as the upper insulating sub-film 73 is formed thereon to form the stacked insulating film 83. Furthermore, the ITO film as the transparent conductive film 74 is formed thereon. The silicon oxide sub-film as the lower insulating sub-film 72 may be formed by, for example, plasma-enhanced CVD with $SiH_4$ and $O_2$ as source gases or plasma-enhanced CVD with tetraethoxysilane (TEOS). The silicon nitride sub-film as the upper insulating sub-film 73 may be formed by plasma-enhanced CVD with $SiH_4$ and $NH_3$ or with $SiH_4$ and $N_2$ as gas sources. The ITO film as the transparent conductive film 74 may be formed by sputtering with an ITO target. The total thickness d2 of the upper insulating sub-film (silicon nitride sub-film) 73 and the transparent conductive film (ITO film) 74 may need to be optimized in response to the thickness of the lower insulating sub-film (silicon oxide sub-film) 72. The lower insulating sub-film (silicon oxide sub-film) 72 preferably has a small thickness. In this case, the lower insulating sub-film (silicon oxide sub-film) 72 has a thickness of about 15 nm. The thickness of the upper insulating sub-film (silicon nitride sub-film) 73 is optimized to about 30 nm, and the transparent conductive film (ITO film) is optimized to about 20 nm, in response to the thickness of the lower insulating sub-film 72. Of course, when the thickness d1 of the insulating sub-film (silicon oxide sub-film) 72 is changed, the thicknesses of the upper insulating sub-film (silicon nitride sub-film) 73 and the transparent conductive film (ITO film) are also changed.

Figure 23B:
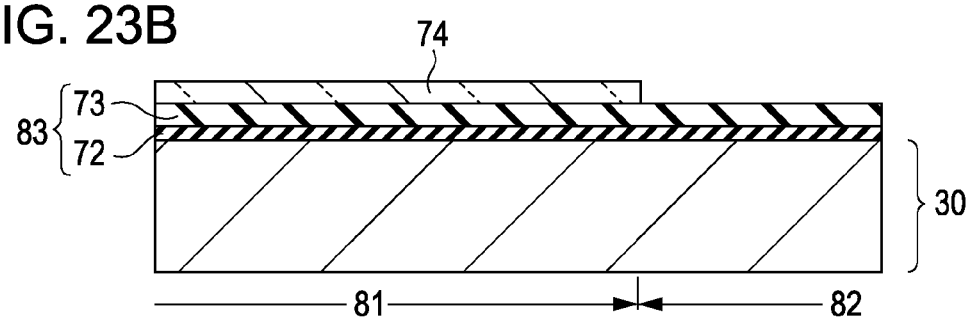

As shown in FIG. 23B, the transparent conductive film (ITO film) 74 is selectively etched to leave the ITO film 74 on a desired portion, i.e., on only the imaging portion 81 where the pixel is formed.

Figure 23C:
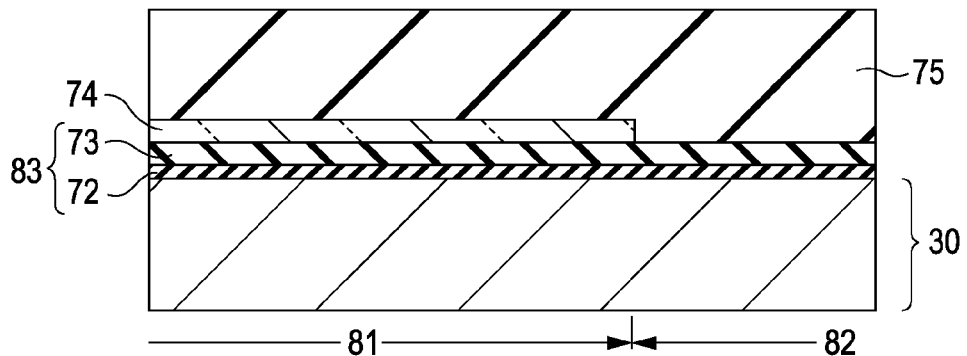

As shown in FIG. 23C, the insulating film (silicon oxide film) 75 having a predetermined thickness is formed on the entire surface of the transparent conductive film (ITO film) 74 and the peripheral circuit portion 82 side. In this embodiment, the insulating film (silicon oxide film) 75 having a thickness of about 150 nm is formed by plasma-enhanced CVD.

Figure 23D:
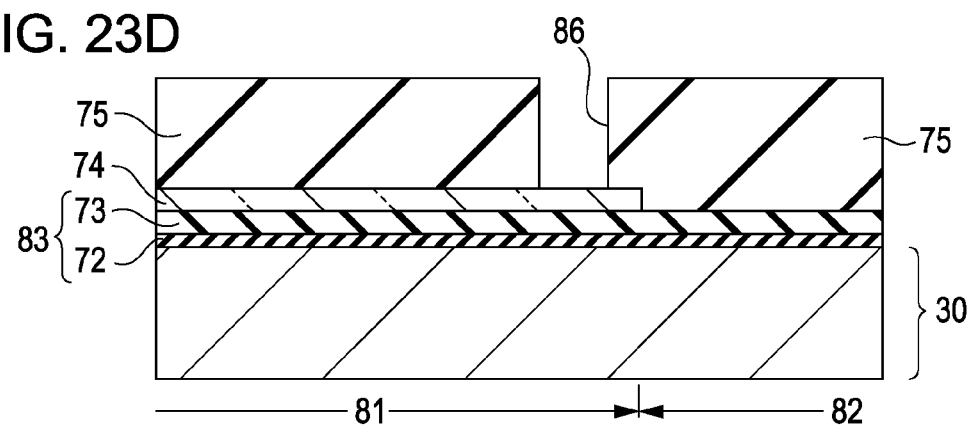

As shown in FIG. 23D, the contact hole 86 for a lead that applies a bias voltage to the transparent conductive film (ITO film) 74 is formed in the insulating film (silicon oxide film) 75.

Figure 24E:
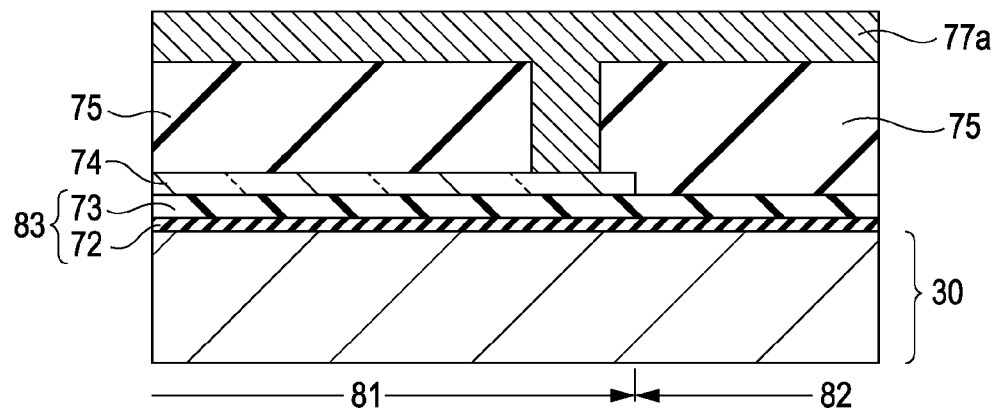
FIGS. 24E to 24G are each a process drawing (2) illustrating a method for producing the solid-state imaging device according to the fifth embodiment.

As shown in FIG. 24E, a metal film 77a functioning as a light-shading film and a lead is formed on the entire surface including the contact hole 86. The metal film 77a may have a multilayer structure. The multilayer structure may be an Al/TiN/Ti structure, the uppermost layer being composed of Al.

Figure 24F:
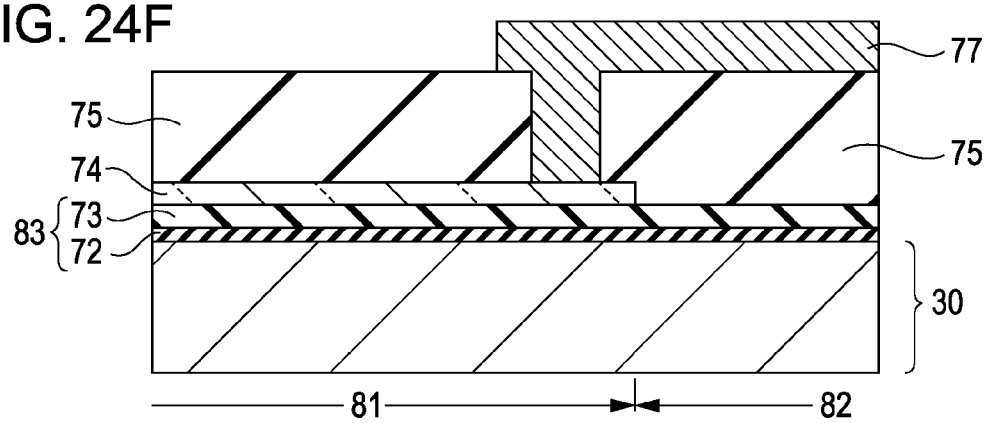

As shown in FIG. 24F, the metal film 77a is patterned to form the lead 77 extending toward the peripheral circuit portion 82 and also functioning as a light-shading film.

Figure 24G:
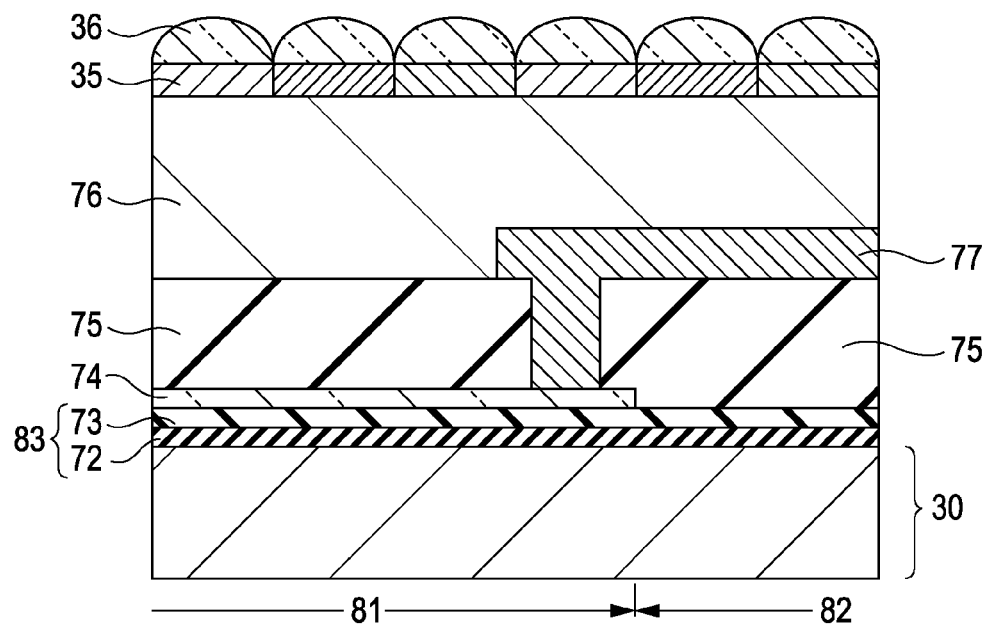

As shown in FIG. 24G, the planarizing film 76 having a predetermined thickness is formed on the entire surface. In this embodiment, an insulating material mainly composed of silicon (Si), oxygen (O), and carbon (C) is applied in such a manner that the resulting film has a thickness of about 1 µm, and then the resulting film is annealed to form the planarizing film 76. The color filter 35 is formed on the planarizing film 76. Furthermore, the on-chip microlens 36 for collecting light is formed thereon. Thereby, the target solid-state imaging device according to the fifth embodiment is produced.

According to the method for producing the solid-state imaging device in accordance with this embodiment, the backside-illumination CMOS solid-state imaging device achieving a well balance between low dark current due to the interface state and high sensitivity can be produced.

In a sixth embodiment, a structure in which the solid-state imaging device shown in each of FIGS. 14 and 20 further includes a p-type semiconductor region (hole-accumulation region) for suppressing the dark current may be used, the p-type semiconductor region being formed on the light-receiving surface of the n-type semiconductor region constituting the photodiode. A combination of the buried photodiode reduces a negative voltage applied to the transparent conductive film and reduces the impurity concentration in the interfacial p-type semiconductor region, thereby obtaining the effect of suppressing the dark current as in the known art.

Furthermore, the fourth, fifth, or sixth embodiment may be combined with the first, second, or third embodiment.

In the fourth, fifth, and sixth embodiments, the backside-illumination CMOS image sensors are provided. Alternatively, front-side-illumination CMOS image sensors may be provided. Furthermore, CCD image sensors may also be provided.

As described above, according to the fourth, fifth, and sixth embodiments, it is possible to produce the camera achieving a well balance between low dark current and improved sensitivity.

Sixth Embodiment

A solid-state imaging device according to a sixth embodiment of the present invention will be described below.

Figure 25:
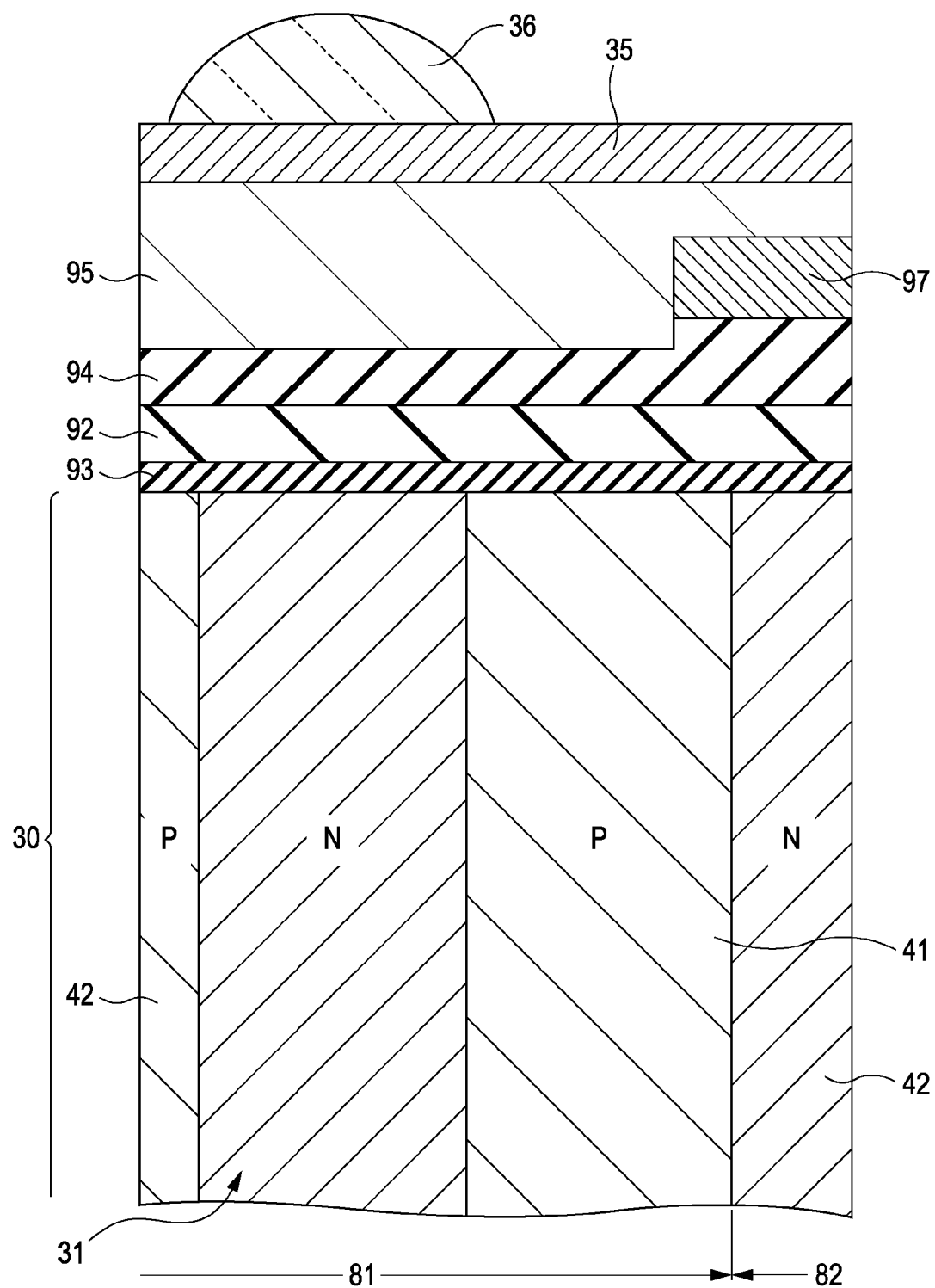
FIG. 25 is a fragmentary cross-sectional view of a substrate of the solid-state imaging device according to the sixth embodiment.

FIG. 25 is a fragmentary cross-sectional view of the pixel portion of a solid-state imaging device according to the sixth embodiment. Also in this embodiment, the solid-state imaging device is of a backside-illumination type. The same elements as those in the first embodiment are designated using the same reference numerals, and redundant description is not repeated.

The solid-state imaging device according to this embodiment includes a film, for example, an at least partially crystallized insulating film 92, having a predetermined thickness d3 and a negative fixed charge, the film being disposed on the light-receiving surface (i.e., the second surface side of the substrate) of the photodetector 31 constituting the photodiode functioning as a photoelectric converter, in other words, the film being disposed on the light-receiving surface of the region of a first conductivity type (n-type charge-accumulation region) 41. The at least partially crystallized insulating film 92 is an insulating film composed of an oxide of an element selected from hafnium, zirconium, aluminum, tantalum, titanium, yttrium, lanthanoids, and the like. The at least partially crystallized insulating film 92 has an at least partially crystallized region in the insulating film.

The at least partially crystallized insulating film 92 may have a thickness of 3 nm to 100 nm. At a thickness of less than 3 nm, the film is not easily crystallized. The upper limit of the thickness may be about 100 nm from a practical point. There is no need for a larger thickness. In view of optical properties such as transmittance, a thickness of several tens of nanometers is optimum.

An insulating film 93 (silicon oxide film in this embodiment) having a predetermined thickness d3 is formed at the interface between the crystallized insulating film 92 and the light-receiving surface of the photodetector 31. The hafnium oxide film as the crystallized insulating film 92 is subjected to crystallization annealing at a predetermined temperature to generate a negative charge in the film. The resulting crystallized insulating film 92 has a potential-controlling function to control the potential of the light-receiving surface of the photodetector 31.

The crystallized insulating film 92 is overlaid with a planarizing film 95 with an insulating film 94, such as a silicon oxide film, having a predetermined thickness provided therebetween. The planarizing film 95 is overlaid with the color filter 35. The color filter 35 is overlaid with the on-chip microlens 36. A light-shading film 97 is disposed on the insulating film (silicon oxide film) 94 in the peripheral circuit portion 82 adjacent to the imaging portion 81 (corresponding to the pixel portion 11).

The crystallized insulating film 92, for example, the hafnium oxide film, has a refractive index of about 2.0. The insulating film (silicon oxide film) 94 disposed on the crystallized insulating film 92 has a refractive index of about 1.45. Thus, an antireflective film constituted by the crystallized insulating film (hafnium oxide film) 92 and the insulating film (silicon oxide film) 94 is formed.

According to the solid-state imaging device in accordance with the sixth embodiment, the film having a negative fixed charge, for example, the at least partially crystallized insulating film 92 is formed on the light-receiving surface of the photodetector 31, thereby resulting in a hole accumulation state on the surface of the photodiode. This can suppress a dark current component due to an interface state. Furthermore, the hole accumulation state can be generated on the surface of the photodiode without known ion implantation or annealing for forming a hole accumulation layer or despite a low dose, thus suppressing the dark current due to the interface state. Furthermore, the antireflective film is constituted by the film having a negative fixed charge, for example, the crystallized insulating film 92 (for example, the hafnium oxide film) and the insulating film (silicon oxide film) 94 on the crystallized insulating film 92, thereby achieving low dark current and high sensitivity.

According to the embodiments of the present invention, a camera including the solid-state imaging device in accordance with the sixth embodiment can have low dark current and improved sensitivity.

This embodiment will be described below in further detail. The above-described photodiode, i.e., the buried photodiode structure having a second region of a second conductivity type (p-type charge accumulation region) disposed on the surface side of the first region of the first conductivity type (n-type charge accumulation region) suppresses the dark current due to carrier generation because of the interface state by forming the hole accumulation state in the vicinity of the interface. When the hole accumulation state cannot be formed by ion implantation, the hole accumulation state in the vicinity of the surface may be formed not by an impurity profile (dopant profile) in the photodiode but by fixed charge in the upper layer of the photodiode. The film in contact with the photodetector preferably has a lower interface state density because the dark current is reduced. That is, it is necessary to form a film having a low interface state density and having a negative fixed charge in the film.

Hafnium oxide deposited by atomic layer deposition is suitable as a material for forming the film having a low interface state density and having a negative fixed charge in the film.

In low-power consumption LSIs, to achieve low leak current, hafnium oxide films each having a thickness of several nanometers have been recently studied. Furthermore, it is known that the crystallization of hafnium oxide increases leak current. In general, hafnium oxide films used for gate-insulating films and each having a thickness of several nanometers seems to be crystallized at about 500° C. Thus, to improve heat resistance, a method for increasing the crystallization temperature by incorporating Si into hafnium oxide is employed. However, in the case where hafnium oxide films are not used for gate-insulating films but are formed on surfaces of photodiodes of image sensors, the leak current properties do not cause problems.

Figure 26:
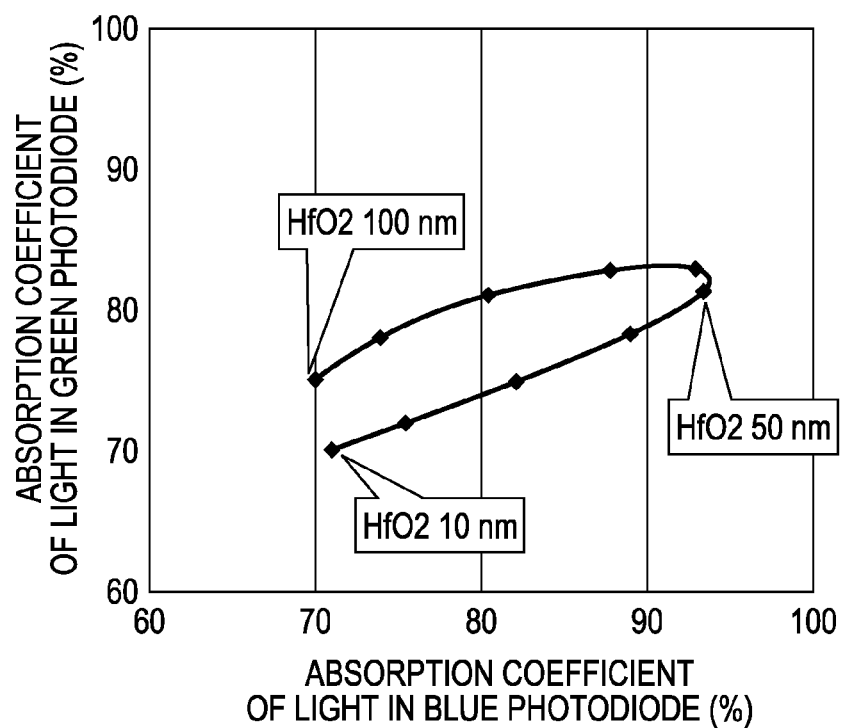
FIG. 26 is a graph illustrating absorption coefficients of light in blue and green photodiodes of the solid-state imaging device including a hafnium oxide film according to the sixth embodiment.

To achieve a low-reflective film structure, as shown in FIG. 26, the hafnium oxide ($HfO_2$) film preferably has a thickness of about 50 nm. FIG. 26 is a graph showing the dependence of the absorption coefficients of a photodiode structure on thickness, the photodiode structure having a silicon oxide ($SiO_2$) film, a hafnium oxide ($HfO_2$) film, a silicon oxide ($SiO_2$) film, and a color filter formed in that order on a photodiode, and the thickness of the hafnium oxide film being changed from 10 nm to 100 nm in 10 nm steps. The longitudinal axis indicates the absorption coefficient (%) of light in a green photodiode. The horizontal axis indicates the absorption coefficient (%) of light in a blue photodiode. At a thickness of about 50 nm, the absorption coefficient of light in the blue photodiode is 90% or more, and the absorption coefficient of light in the green photodiode is 80% or more.

Figure 27A:
FIGS. 27A and 27B are each a TEM photograph of the hafnium oxide film with or without heat treatment.
Figure 27B:
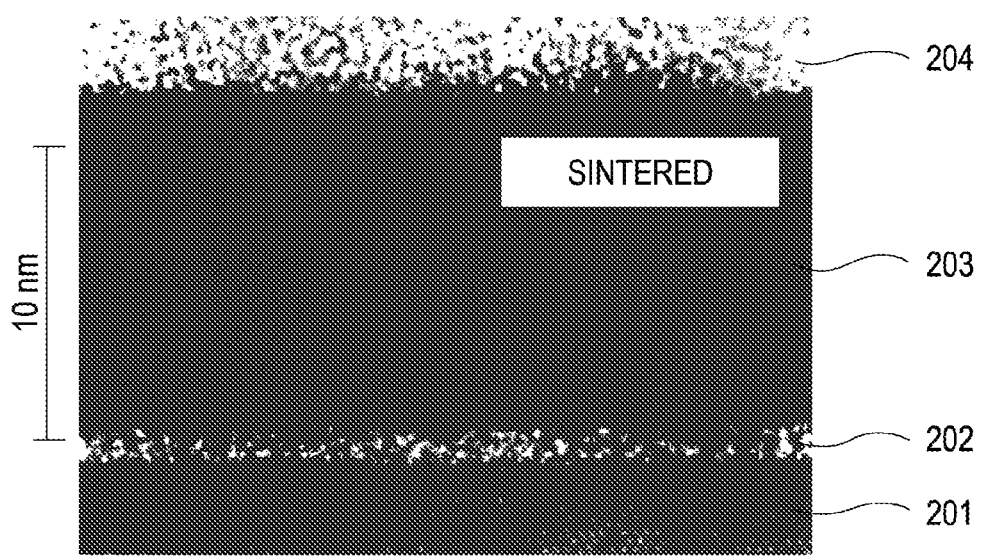

As described above, it was found that the thick hafnium oxide film that has not been used for known MOS-LSIs in the past has a low crystallization temperature, and crystallization begins at about 300° C. FIGS. 27A and 27B are each a TEM photograph of a hafnium oxide film with or without heat treatment at 320° C. for 16 hours. FIG. 27A is a TEM photograph of the hafnium oxide film without thermal oxidation treatment. FIG. 27B is a TEM photograph of the hafnium oxide film after thermal oxidation treatment. In each of FIGS. 27A and 27B, a silicon oxide film 202, a hafnium oxide film 203, and a silicon oxide film 204 serving as a protective film are stacked in that order on a silicon substrate 201. FIG. 27B shows that the hafnium oxide film 203 is entirely crystallized after heat treatment. In the hafnium oxide film 203 not subjected to heat treatment shown in FIG. 27A, crystallization is limited to a local region in the film.

Figure 28:
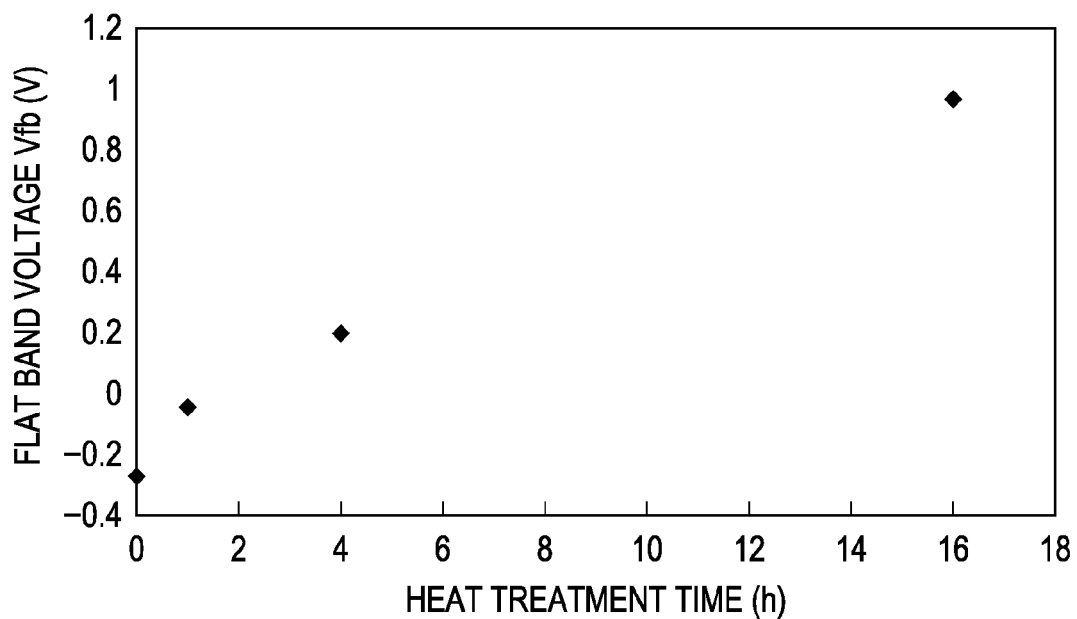
FIG. 28 is a graph showing the dependence of a flat band voltage Vfb of a MOS capacitor including the hafnium oxide film on heat treatment time.
Figure 29:
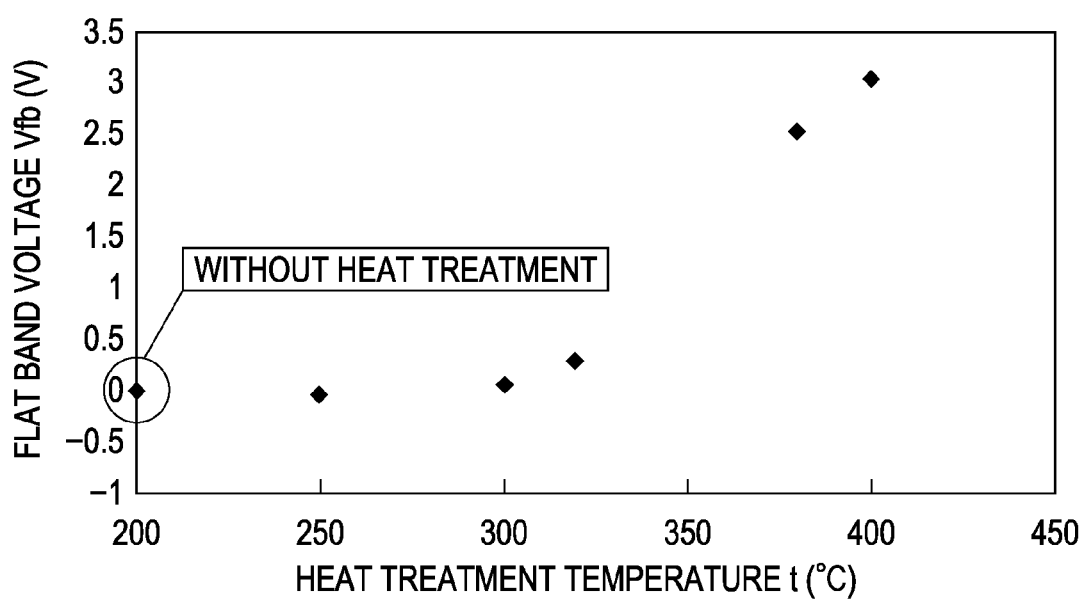
FIG. 29 is a graph showing the dependence of a flat band voltage Vfb of a MOS capacitor including the hafnium oxide film on heat treatment temperature.

FIG. 28 shows the behavior of fixed charge in the hafnium oxide film during crystallization by heat treatment. FIG. 29 shows C-V characteristics of a MOS capacitor including a stacked film having a hafnium oxide ($HfO_2$) film with a thickness of 10 nm and a silicon oxide ($SiO_2$) film, the stacked film functioning as a gate-insulating film. FIG. 28 shows the results of measurement of the flat band voltage Vfb of the MOS capacitor, the heat treatment temperature being fixed at 320° C., and the heat treatment time being changed. FIG. 28 shows that the flat band voltage Vfb shifts toward higher voltages as the heat treatment time is prolonged. That is, the results demonstrate an increase in the amount of negative charge in the hafnium oxide film.

Similarly, FIG. 29 shows the behavior of the flat band voltage Vfb of the MOS capacitor, the heat treatment time being fixed at one hour, and the heat treatment temperature being changed. Also in this case, the results demonstrate that the flat band voltage Vfb shifts toward higher voltages as the heat treatment temperature increases. That is, the results demonstrate an increase in the amount of negative charge in the hafnium oxide film.

The use of the thick hafnium oxide film having a thickness of, for example, 50 nm can achieve a low-reflective structure and can reduce the crystallization temperature to increase the amount of negative charge in the insulation film. Thus, the hafnium oxide film is suitable for the solid-state imaging device. As described above, it was found that the heat treatment of the hafnium oxide film having a thickness of 10 nm or more at 400° C. or lower results in the formation of the crystallized hafnium oxide film. Furthermore, it was found that the negative charge is formed in the hafnium oxide film as the heat treatment time or heat treatment temperature is increased, i.e., as the crystallization proceeds. For the known applications for MOS-LSIs and gate-insulating films, a large amount of negative charge and an increase in leak current due to crystallization are disadvantageous characteristics. However, in this embodiment, the hafnium oxide film is significantly effective for the accumulation of holes on the surface of the photodiode of the solid-state imaging device. The use of the hafnium oxide film results in the formation of the hole accumulation state on the surface of the photodiode by a low-temperature process at a temperature of 400° C. or lower, thus suppressing the dark current.

In this embodiment, the hafnium oxide film has been described. Alternatively, an insulating film composed of an oxide of an element selected from zirconium, aluminum, tantalum, titanium, yttrium, lanthanoids, and the like can also form the negative fixed charge in the film. The formation of one of these oxide insulating films on the light-receiving surface results in the formation of the hole accumulation state on the surface of the photodiode, thus suppressing the dark current.

FIGS. 30A to 32G show an embodiment of a method for producing the solid-state imaging device according to the sixth embodiment. FIGS. 30A to 32G are each a schematic cross-sectional view showing the imaging portion 81 and the peripheral circuit portion 82.

Figure 30A:
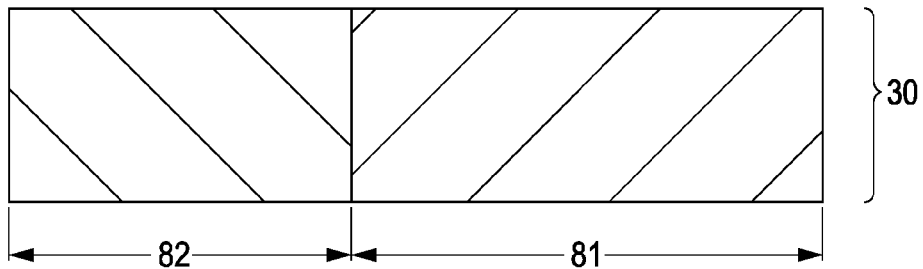
FIGS. 30A to 30C are each a process drawing (1) illustrating a method for producing the solid-state imaging device according to the sixth embodiment.

A plurality of pixels are formed in a two-dimensional array in the imaging portion 81 of the semiconductor substrate 30 shown in FIG. 30A. A logic circuit and the like are formed in the peripheral circuit portion 82.

Figure 30B:
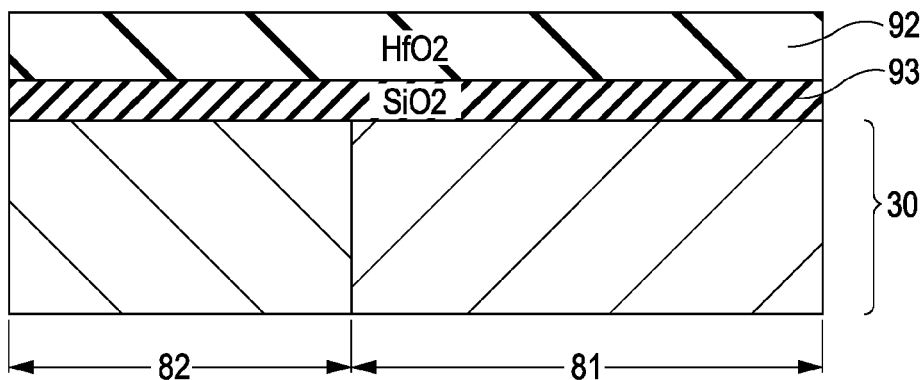

As shown in FIG. 30B, the hafnium oxide film 92 is formed by ALD on the entire surface of the imaging portion 81 and the peripheral circuit portion 82. The hafnium oxide film 92 has a refractive index of about 2.0. Thus, the appropriate adjustment of the thickness of the film results in the acquisition of an antireflective effect. Preferably, the hafnium oxide film 92 having a thickness of 50 nm to 60 nm is formed. Furthermore, when the hafnium oxide film 92 is formed by ALD, a silicon oxide film 93 having a thickness of about 1 nm is formed at the interface between the surface of the substrate 30, i.e., the surface of the photodiode, and the hafnium oxide film 92.

Figure 30C:
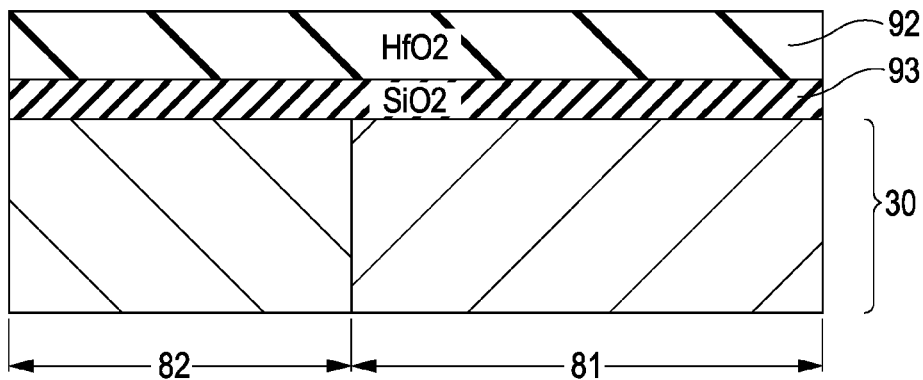

As shown in FIG. 30C, the hafnium oxide film 92 is subjected to crystallization annealing to form the negative fixed charge in the hafnium oxide film.

As shown in FIG. 30D, a silicon oxide film 94 and then a light-shading film 97 are formed on the hafnium oxide film 92. By forming the silicon oxide film 94, the hafnium oxide film 92 is not in direct contact with the light-shading film 97, thereby inhibiting the reaction of the hafnium oxide film 92 and the light-shading film 97 due to the contact thereof. Furthermore, the silicon oxide film 94 can prevent the surface of the hafnium oxide film 92 from being etched during etching of the light-shading film 97. The light-shading film 97 is preferably composed of tungsten (W) that has a satisfactory light-shading ability.

Figure 31D:
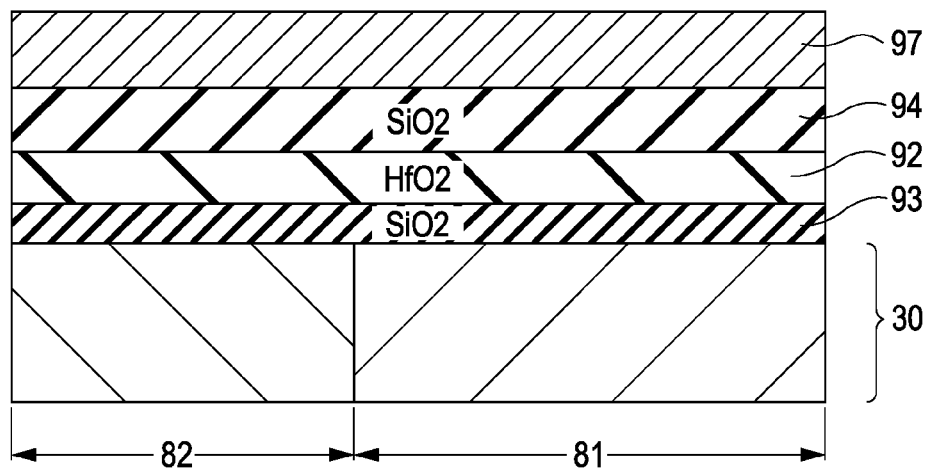
Figure 31E:
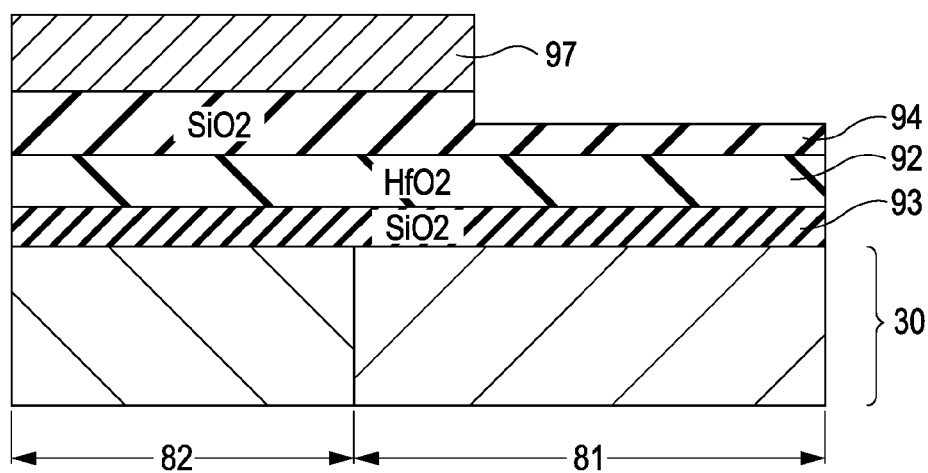

As shown in FIG. 31E, the light-shading film 97 is selectively removed such that the imaging portion 81 is partially covered with the light-shading film 97 and such that the peripheral circuit portion 82 is completely covered with the light-shading film 97. The processed light-shading film 97 forms a light-shading region in the photodiode. The black level of an image is determined by the output of the photodiode. Furthermore, the light-shading film 97 inhibits a variation in properties due to light incident on the peripheral circuit portion 82.

Figure 32F:
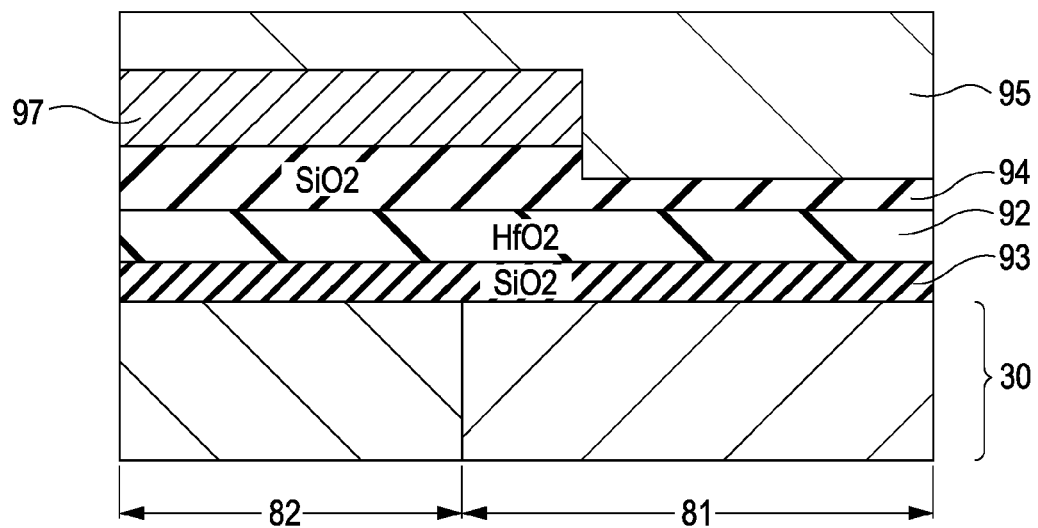
FIGS. 32F and 32G are each a process drawing (3) illustrating a method for producing the solid-state imaging device according to the sixth embodiment.

As shown in FIG. 32F, the planarizing film 95 is formed to flatten bumps due to the light-shading film 97.

Figure 32G:
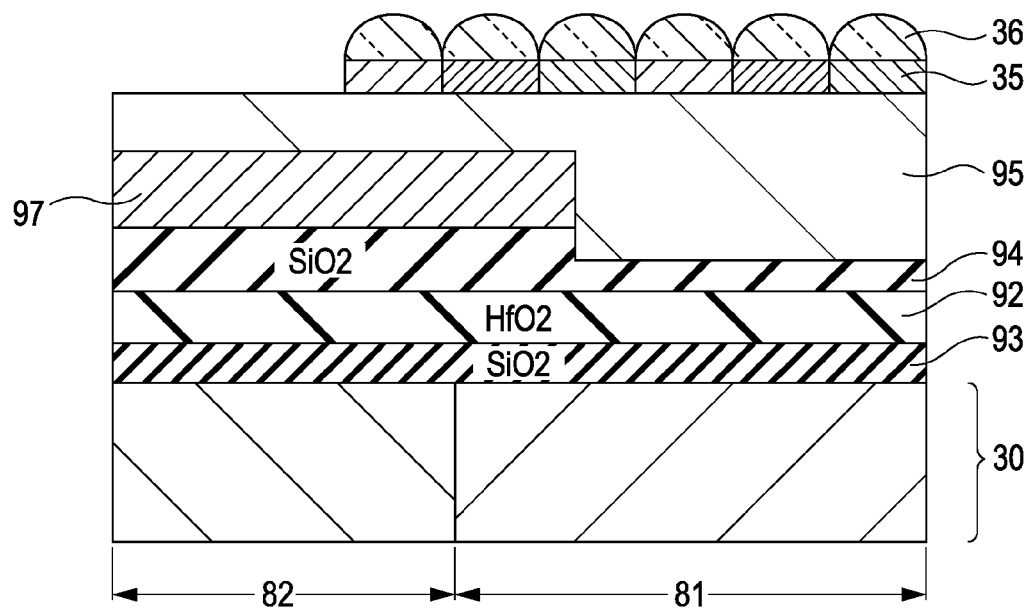

As shown in FIG. 32G, the color filter 35 is formed on the imaging portion 81 side on the planarizing film 95. Furthermore, the on-chip microlens 36 that collects light is formed thereon. Thereby, the target solid-state imaging device according to the sixth embodiment is produced.

The present invention is not limited to the description of the embodiments.

For example, the values and the materials described in the embodiments are used as examples. The present invention is not limited thereto.

Furthermore, various modifications can be made without departing from the scope of the invention.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    a substrate having a first surface and a second surface, light being incident on the second surface side;
    a wiring layer disposed on the first surface side;
    a photodetector formed in the substrate, the photodector including an n-type charge-accumulation region and a p-type hole-accumulation region that is disposed on the first surface side;
    a transfer gate of a transfer transistor disposed on the first surface of the substrate and adjacent to the photodetector, the transfer gate transferring a signal charge accumulated in the photodetector; and
    a control gate disposed on the first surface of the substrate and provided separately from the transfer gate of the transfer transistor to control a potential of the photodetector in a vicinity of the first surface of the substrate, the control gate being disposed such that the control gate only partially overlaps the photodetector along a direction parallel to the first surface of the substrate, and the p-type hole-accumulation region being disposed at least in a part of the photodector that is not overlapped by the control gate.

2. The solid-state imaging device according to claim 1, wherein the photodetector further includes another p-type hole-accumulation region that is disposed on the second surface side.

3. A camera comprising:
    a solid-state imaging device that includes a substrate having a first surface and a second surface, light being incident on the second surface side;
    an optical system that guides incident light to the second surface side; and
    a signal-processing circuit that processes an output signal of the solid-state imaging device,
    wherein,
    the solid-state imaging device further includes
        (a) a wiring layer disposed on the first surface side,
        (b) a photodetector disposed in the substrate, the photodector including an n-type charge-accumulation region and a p-type hole-accumulation region that is disposed on the first surface side,
        (c) a transfer gate of a transfer transistor disposed on the first surface of the substrate and adjacent to the photodetector, the transfer gate transferring a signal charge accumulated in the photodetector; and
        (d) a control gate disposed on the first surface of the substrate and provided separately from the transfer gate of the transfer transistor to control a potential of the photodetector in a vicinity of the first surface of the substrate, the control gate being disposed such that the control gate only partially overlaps the photodetector along a direction parallel to the first surface of the substrate, and the p-type hole-accumulation region being disposed at least in a part of the photodector that is not overlapped by the control gate.

4. The solid-state imaging device according to claim 1, further comprising:

an insulating film disposed on the second surface of the substrate with a light-shading film disposed on the insulating film and a protective film disposed on the light-shading film;

a color filter overlaid over the protective film that transmits light with a predetermined wavelength; and a microlens that allows incident light to converge on the photodetector, the microlens being disposed on the color filter.

5. The solid-state imaging device according to claim 1, wherein a concentration of impurities within the n-type charge-accumulation region of the photodector increases towards the first surface of the substrate.

6. The solid-state imaging device according to claim 1, wherein the p-type hole-accumulation region is a shallow p-type hole-accumulation region.

7. The solid-state imaging device according to claim 1, wherein the transfer gate and the control gate are separated from the first surface of the substrate by a gate-insulating film.

8. The solid-state imaging device according to claim 1, wherein the solid-state imaging device is configured such that a negative voltage is applied to the control gate during a period of charge accumulation in the photodector so that holes are accumulated in the vicinity of the first surface of the substrate to reduce a dark current.

9. The solid-state imaging device according to claim 1, wherein the control gate is disposed next to the transfer gate of the transfer transistor along the direction parallel to the first surface of the substrate, and the transfer gate and the control gate are separated from each other by an insulating film.

10. The solid-state imaging device according to claim 1, wherein the control gate and the p-type hole-accumulation region do not overlap.

* * * * *